United States Patent [19]
Tobita

[11] Patent Number: 5,801,412
[45] Date of Patent: Sep. 1, 1998

[54] SEMICONDUCTOR DEVICE HAVING A CAPACITANCE ELEMENT WITH EXCELLENT AREA EFFICIENCY

[75] Inventor: Youichi Tobita, Hyogo, Japan

[73] Assignee: Mitsubishi Denki Kabushiki Kaisha, Tokyo, Japan

[21] Appl. No.: 681,442

[22] Filed: Jul. 23, 1996

[30] Foreign Application Priority Data

Sep. 4, 1995 [JP] Japan ................... 7-226451

[51] Int. Cl.$^6$ .................. H01L 27/108; H01L 29/76; H01L 29/94; H01G 9/06
[52] U.S. Cl. .................. 257/206; 361/321.3; 326/68; 257/905; 257/907
[58] Field of Search ................. 257/298–300, 257/304–308, 263, 905, 908; 361/321.3; 326/68, 149; 365/182

[56] References Cited

U.S. PATENT DOCUMENTS

| | | | |
|---|---|---|---|
| 4,879,631 | 11/1989 | Johnson et al. | 361/321.3 |
| 4,980,799 | 12/1990 | Tobita | 365/182 |
| 5,243,209 | 9/1993 | Ishii | 257/263 |
| 5,465,058 | 11/1995 | Krenik et al. | 326/68 |

FOREIGN PATENT DOCUMENTS

| | | |
|---|---|---|
| 58-009289A | 1/1983 | Japan . |
| 61-050282A | 3/1986 | Japan . |
| 01 080066A | 3/1989 | Japan . |
| 02 276088A | 11/1990 | Japan . |
| 06 215570A | 8/1994 | Japan . |

*Primary Examiner*—Tom Thomas
*Assistant Examiner*—Adriana Giordana
*Attorney, Agent, or Firm*—McDermott, Will & Emery

[57] ABSTRACT

N type impurity regions are formed at the surface of N well similarly to a DRAM memory cell. Electrode layers corresponding to storage nodes and conductive layers 9a and 9b corresponding to cell plates are formed for predetermined impurity regions among the impurity regions. Conductive layers are isolated from each other electrically in a DC fashion and connected to electrode nodes VA and VB, respectively. The sets of capacitors formed by a predetermined number of memory cell capacitors connected in parallel through the N well are connected in series. As a result, a capacitor with excellent area efficiency which utilizes the characteristics of the memory cell capacitor can be realized.

26 Claims, 25 Drawing Sheets

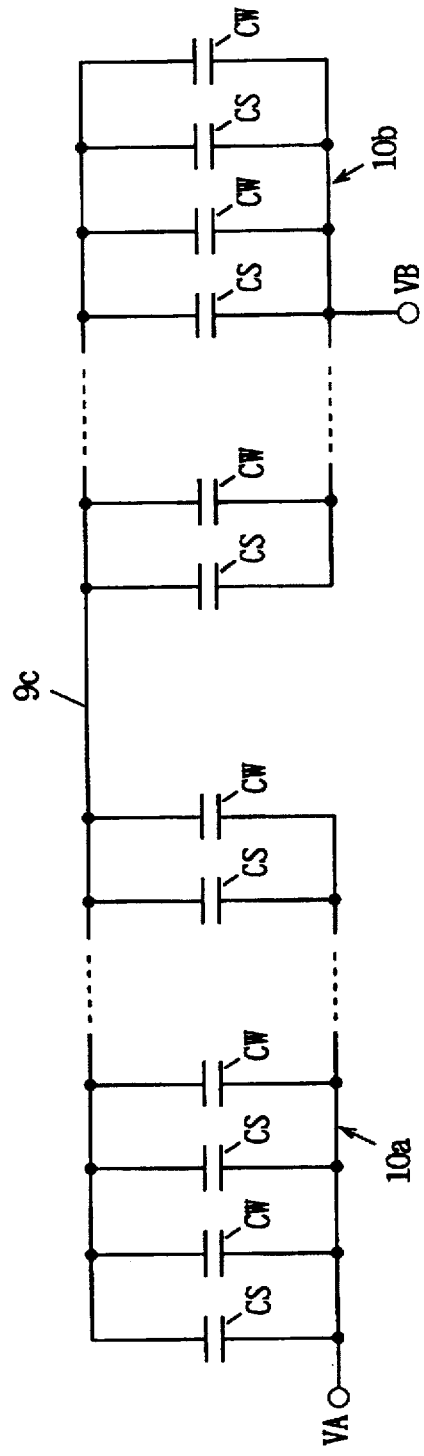
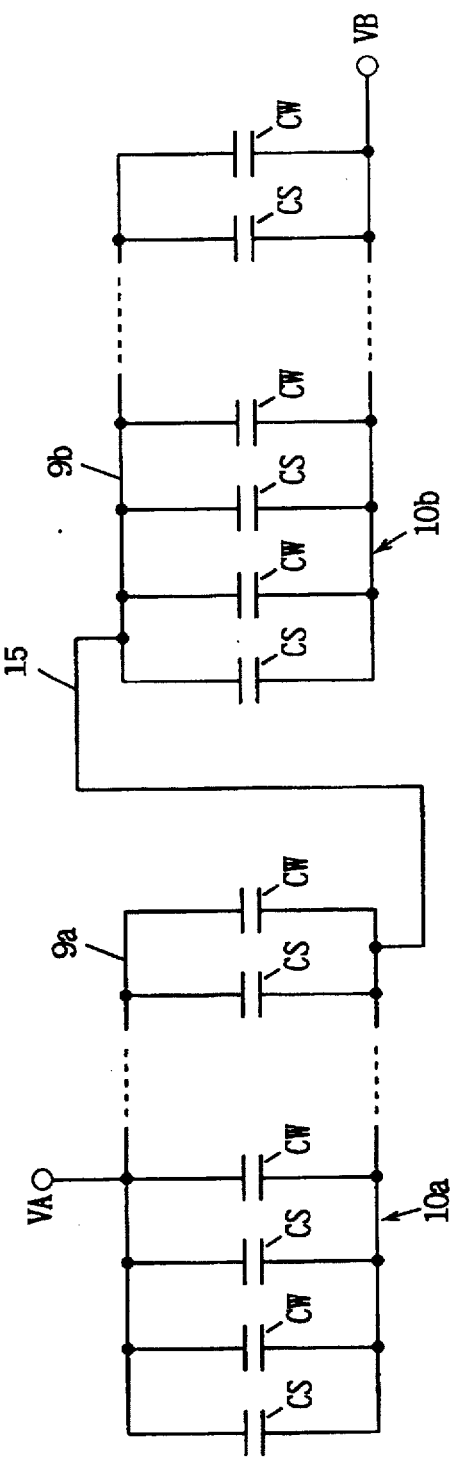
FIG. 24A
FIG. 24B

SEMICONDUCTOR DEVICE HAVING A CAPACITANCE ELEMENT WITH EXCELLENT AREA EFFICIENCY

BACKGROUND OF THE INVENTION

1. Field of the Invention

The present invention relates to structures of a capacitance element with excellent area efficiency and, more particularly, to a capacitance element with reduced occupying area suitable for use in a dynamic type semiconductor memory device and to use of such a capacitance element.

2. Description of the Background Art

In applied practical products utilizing a DRAM (Dynamic Type Semiconductor Memory Device) such as a personal computer, increase in operation speed and in number of bits of information is sought to process information at a high speed. In order to meet such demands of the applied practical products, increase in operation speed and in number of I/O (increase in number of bits for data input/output (the number of input/output nodes)) is advanced also in the DRAM used as a main memory device and the like in the applied practical products.

High speed operation results in high speed charging and discharging of a signal line in a DRAM. In addition, increase in number of I/O leads to increase in number of input/output buffer circuits operating at the same time, thereby increasing a charging current from a power supply line and a discharging current to a ground line. As a result, voltage noise becomes significant on the power supply line and the ground line on the DRAM chip, whereby operating margin which determines the voltage range for stable operation of an internal circuit of the device is reduced and stable operation of the DRAM becomes difficult. For example, when the power supply voltage is 5 V and the voltage noise is 0.5 V, the device stably operates with the power supply voltage of 4.5 V. However, if the voltage noise is as high as 1.0 V and the power supply voltage is 5 V under the same conditions, the circuit operates at 4.0 V because of the voltage noise. Therefore, if the power supply voltage falls short of 5 V, stable operation of the internal circuit is not guaranteed because of the voltage noise.

Especially, in a DRAM of a generation of and after 16M bit DRAM, an internal power supply circuit is usually provided for down-converting an external power supply voltage and producing an internal power supply voltage. In such internal power supply circuit, an MOS transistor (insulated gate type field effect transistor) is provided between an external power supply node and an internal power supply line. The gate potential of the MOS transistor is adjusted in accordance with the voltage level on the internal power supply line and the amount of current flowing from the external power supply node to the internal power supply line is adjusted, thereby producing an internal power supply voltage at a desired voltage level.

When the internal circuit operates and a charging current flows from the internal power supply line to the internal circuit, the charging current is supplied from the external power supply node through the MOS transistor. The MOS transistor is accompanied with channel resistance. The impedance of the internal power supply line is higher due to the channel resistance and the voltage on the internal power supply line is reduced by a greater magnitude by the impedance component when the charging current is generated (the magnitude is given by the product of impedance component Z and charging current I) than in the device which does not have such an internal power supply circuit.

As a result, the voltage noise increases, and decrease in operating margin due to the voltage noise is more prominent.

In order to suppress such effects of the voltage noise on the power supply line and the ground line, a decoupling capacitor 1004 is provided between a power supply line 1000 and a ground line 1002 as shown in FIG. 38. Decoupling capacitor 1004 is located near an internal circuit 1006 operating with a power supply voltage VCC on power supply line 1000 and a ground voltage VSS on a ground line 1002 as the two operational power supply voltages.

When internal circuit 1006 operates and a current flows through power supply line 1000 to lower power supply voltage VCC, a current Ia is supplied to internal circuit 1006 from decoupling capacitor 1004 by the accumulated electric charges thereof, and the current consumed by internal circuit 1006 is compensated for. As a result, fluctuation in power supply voltage VCC on power supply line 1000 is suppressed.

When the voltage level of ground voltage VSS on ground line 1002 is raised by the discharging current during operation of internal circuit 1006, decoupling capacitor 1004 absorbs the discharging current Ib from internal circuit 1006, thereby suppressing fluctuation in ground voltage VSS on ground line 1002.

Current Ia or Ib which can be supplied or absorbed by decoupling capacitor 1004 as shown in FIG. 38 is determined by the amount of charges accumulated therein. Therefore, the greater effect of suppressing the voltage noise is given by decoupling capacitor 1004 with greater capacitance of the decoupling capacitor (this is evidenced by the relationship of Q=C·V, where Q indicates the amount of accumulated charges, C indicates the electrostatic capacitance, and V indicates the voltage applied to the capacitor).

Since the capacitance value of the capacitor is generally in proportion to the facing area of the electrodes, greater capacitance value of the decoupling capacitor results in wider area occupied by the capacitor and therefore in wider area of the chip, thereby increasing cost of the chip.

Furthermore, a stabilizing capacitor for keeping stable the voltage of a predetermined internal node and a charge pumping capacitor for generating a voltage at a predetermined level are often used in a semiconductor device. The circuits employing such charge pumping capacitor in a DRAM include a charge pumping circuit for generating a high voltage VPP transmitted to a selected word line and a charge pumping circuit for generating a negative voltage Vbb for substrate bias applied to a substrate region of a memory cell array. These capacitors are also required to have a great capacitance value to fully accomplish their functions. Therefore, similarly to the decoupling capacitor, increase in capacitance value of these capacitors also leads to an undesirable increase in chip cost due to increase in occupying area.

Japanese Patent Laying-Open No. 2-276088 discloses a structure in which capacitors with the same structure as that of a DRAM memory cell capacitor are connected in series and employed as a capacitor element. However, the object of this prior art is to reduce parasitic capacitance accompanying the capacitor and improvement in area efficiency of the capacitor is not considered.

SUMMARY OF THE INVENTION

An object of the present invention is to provide a semiconductor device including a capacitance element with excellent area efficiency.

Another object of the present invention is to implement a structure of a capacitance element with excellent area efficiency which is suitable for use in a DRAM.

Still another object of the present invention is to provide a capacitance element with excellent area efficiency and suitable for use in a DRAM including a memory cell which has a stacked capacitor.

The capacitance element of the semiconductor device according to the present invention includes: a plurality of first impurity regions of a first conductivity type arranged at a surface of a semiconductor substrate region of the first conductivity type and spaced apart from each other; a plurality of first conductive layers each electrically connected to a predetermined first impurity region among the plurality of first impurity regions, formed to have a prescribed shape on the surface of the semiconductor substrate region, and arranged to be isolated from others, and divided into first and second groups each having at least one conductive layer; a second conductive layer arranged to face the first conductive layer in the first group with a first insulating film interposed therebetween; and a third conductive layer arranged to face the first conductive layer in the second group with a second insulating film interposed therebetween and arranged to be isolated from the second conductive layer. One of the second conductive layer and the substrate region serves as one electrode node of the capacitance element, and one of the third conductive layer and the substrate region serves as another electrode node. When the substrate region serves as the above-mentioned one and another electrode nodes of the capacitance element, the substrate region is divided into two regions. A plurality of capacitors are connected in parallel, so that a capacitor with a great capacitance can be obtained in a small area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 24A and 24B show electrically equivalent circuits of semiconductor devices according to an eleventh embodiment of the present invention.

DESCRIPTION OF THE PREFERRED EMBODIMENTS

[Fundamental Structure of the Invention]

Figure 1:
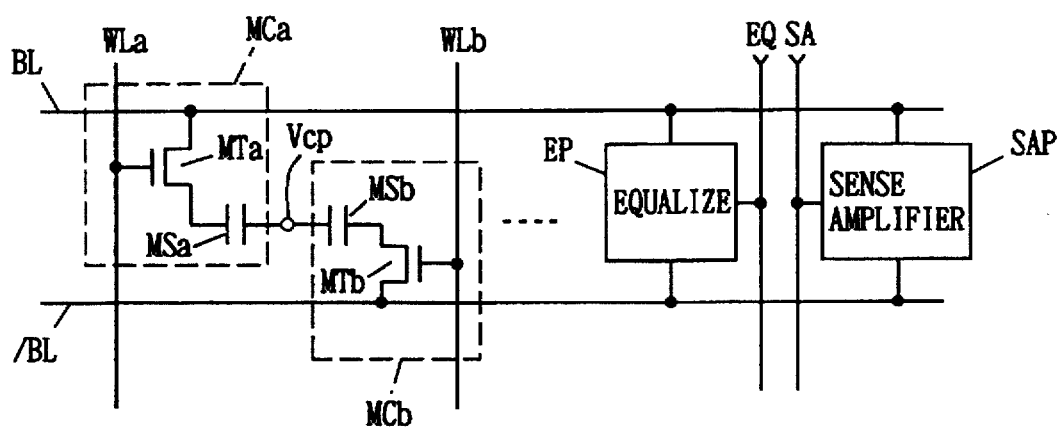
FIG. 1 schematically shows a structure of an array portion of a semiconductor memory device to which the present invention is applied.

FIG. 1 is a diagram showing a structure of a memory cell array portion of a commonly-used DRAM. Referring to FIG. 1, a pair of bit lines BL and /BL and two word lines WLa and WLb are shown representatively. Usually, in a memory cell array of a DRAM, memory cells are arranged in a matrix of rows and columns, a word line is arranged corresponding to each row, and each word line is connected to the memory cells on the corresponding row. A pair of bit lines are arranged corresponding to each column and connected to the memory cells in the corresponding column.

In FIG. 1, a memory cell MCa is arranged corresponding to a crossing between word line WLa and bit line BL, and a memory cell MCb is arranged corresponding to a crossing of bit line /BL and word line WLb. Memory cell MCa includes a memory cell capacitor MSa for storing information in the form of electric charges and an access transistor MTa responsive to a signal potential of word line WLa for electrically connecting memory cell capacitor MSa with bit line BL. Similarly, memory cell MCb includes a memory cell capacitor MSb for storing information in the form of electric charges, and an access transistor MTb responsive to a signal potential of word line WLb for electrically connecting memory cell capacitor MSb with bit line /BL. Respective one-side electrodes (cell plate electrode; common electrode) receive a predetermined potential VCP (=VCC/2).

Figure 2:
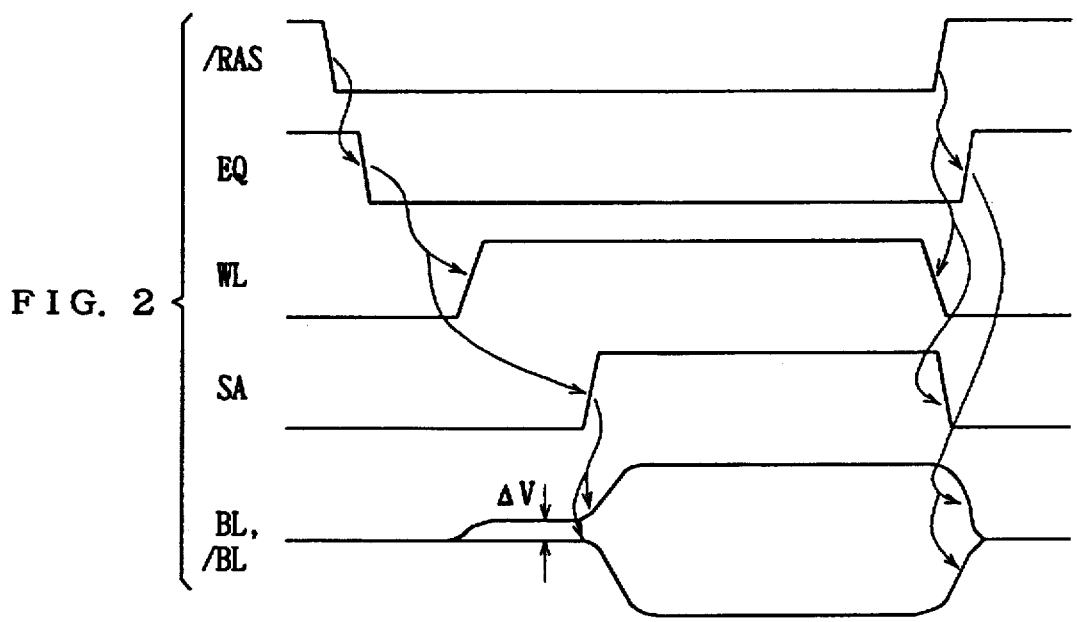
FIG. 2 is a signal waveform diagram representing operation of the semiconductor memory device of FIG. 1.

An equalize/precharge circuit EP and a sense amplifier SAP are arranged for bit lines BL and /BL. Equalize/precharge circuit EP is responsive to an equalize signal EQ, precharges bit lines BL and /BL to a predetermined potential (VCC/2) and electrically short-circuits bit lines BL and /BL with each other. Sense amplifier SAP is activated in response to a sense amplifier activation signal SA and differentially amplifies the potentials of bit lines BL and /BL. Now, operation of the DRAM shown in FIG. 1 will be described with reference to FIG. 2 showing operation waveforms thereof.

The operation cycle of a DRAM is determined by an externally applied row address strobe signal /RAS. When row address strobe signal /RAS is at a high level, the DRAM is in a non-selected state, or a standby state. In the standby state, equalize signal EQ maintains an active state at a high level, and equalize/precharge circuit EP operates to precharge and equalize bit lines BL and /BL to a predetermined potential (intermediate potential VCC/2). Word lines WLa and WLb (WL) are in a non-selected state and the potentials thereof are at a low level. Therefore, access transistors MTa and MTb maintain an off state in memory cells in MCa and MCb. Similarly, sense amplifier activation signal SA also maintains an inactive state at a low level.

When row address strobe signal /RAS falls to a low level, the DRAM enters a selected state, and a memory cycle (active cycle) is initiated. In response to this fall of row address strobe signal /RAS, equalize instruction signal EQ attains a low level, rendering equalize/precharge circuit EQ inactive. In such a situation, bit lines BL and /BL are in a floating state at the level of intermediate voltage VCC/2. Next, in response to the fall of row address strobe signal /RAS, a row address signal is incorporated and decoded at an unshown portion, and the potential of word line WL designated by the row address signal rises. As a result, the potential of the selected word line WL (WLa or WLb) rises to a high level, so that information stored in the memory cell (MCa or MCb) connected to the select word line WL is transmitted to the corresponding bit line.

Assuming that word line WLa is selected, access transistor MTa enters an on state and memory cell capacitor MSa is electrically connected to bit line BL in memory cell MCa. In accordance with the amount of electric charges accumulated in memory cell capacitor MSa, electric charges move between bit line BL and memory cell capacitor MSa. FIG. 2 shows a case where high level data is stored in memory cell capacitor MSa and the potential of bit line BL rises. After the read out of the information to bit line BL, sense amplifier activation signal SA is rendered active at a high level when the difference in potential between bit lines BL and /BL is sufficiently great.

Usually, sense amplifier SAP includes a P sense amplifier formed by cross-coupled p channel MOS transistors and an N sense amplifier formed by cross-coupled n channel MOS transistors. In such a case, the P sense amplifier and the N sense amplifier are coupled to power supply potential VCC and ground voltage VSS respectively in accordance with the sense amplifier activation signal. Although there are thus two kinds of sense amplifier activation signals, FIGS. 1 and 2 show sense amplifier activation signal SA representatively. Consequently, the potentials of bit lines BL and /BL are set at a high level and a low level in accordance with the information stored in the selected memory cell. More specifically, the potential of bit line BL rises to power supply potential VCC level, while the potential of bit line /BL falls to ground potential VSS level. Thereafter, data is read out/written from/to the selected memory cell in accordance with the designated operation mode.

When one memory cycle is completed, the externally applied row address strobe signal /RAS rises to a high level, the potential of selected word line WL (WLa) falls to a low level, and then sense amplifier activation signal SA attains a low level in an inactive state. Equalize signal EQ attains an active state at a high level, and equalize/precharge circuit EP is activated to precharge and equalize bit lines BL and /BL to a predetermined intermediate potential (VCC/2).

The amount $\Delta V$ of change in potential of the bit line (readout voltage) upon selection of a memory cell is obtained as follows. Assume that parasitic capacitance of bit lines BL and /BL is indicated as CB and the capacitance value of memory cell capacitor MS (MSa and MSb) as CS. The potential VSN of a storage node (connection point between the access transistor and the memory cell capacitor) is power supply potential VCC or ground potential VSS (0 V). Assuming that the bit line precharge potential is indicated as VBL, the accumulated electric charges Qb and Qs of the bit line and the storage node in the standby state are given by the following equations.

$$Qb=CB \cdot VBL=CB \cdot VCC/2$$

$$Qs=CS \cdot (VSN-VCP)$$

Meanwhile, when the potential of the selected word line rises and data of the memory cell is transmitted to the bit line, the potential of the bit line is equal to that of the storage node to attain VBL+$\Delta V$. The amount of accumulated charges Qb' and Qs' of the bit line and the storage node of the memory cell capacitor in this state are given by the following equations.

$$Qb'=CB \cdot (VBL+\Delta V)$$

$$Qs'=CS \; (VBL+\Delta V+VCP)$$

The change in potential of the bit line and the storage node upon selection of a memory cell is caused by movement of the accumulated charges of the bit line and the memory cell capacitor, and the total amount of electric charges remain unchanged (charge conservation law). Therefore, the following equation holds.

$$Qb+Qs=Qb'+Qs'$$

The following equation is obtained from the equation above.

$$(CB+CS)\cdot\Delta V=CS\ (VSN-VBL)$$

Since VSN=VCC or 0 and VBL=VCC/2, the following equation is obtained.

$$\Delta V=\pm VCC/\{2(1+CB/CS)\}=\pm VCC\cdot CS/2\cdot CB$$

As apparent from the equations above, the absolute value of readout voltage ΔV is increased as the value of CS/CB is increased. The capacitance of the bit line is determined by the length of the bit line and the number of access transistors connected thereto. In order to reduce bit line capacitance CB as much as possible, a block division method or the like is adopted in a DRAM so that the bit line is reduced in length and the number of memory cells connected thereto is decreased. However, there is naturally a limit to such reduction in value of bit line capacitance CB. Therefore, increasing the capacitance value of memory cell capacitor CS as much as possible is required for greater absolute value of readout voltage ΔV.

In a DRAM, when the amount of accumulated charges is changed by production of hole · electron pairs due to an incident α-ray, the value of readout voltage ΔV is changed, preventing accurate readout of the data in the memory cell. In a static random access memory (SRAM), a memory cell has the structure of a flipflop and a threshold voltage of a memory transistor is determined by the accumulated charges of the floating gate in a memory cell of a flash memory. Therefore, The effects of incident α-ray is smaller than in a DRAM. In order to reduce such effects of α-ray and produce a sufficient readout voltage, a memory cell capacitor has as great an amount of the accumulated charges as possible in a DRAM. Especially when power supply voltage VCC is as small as 2.5 V or 1.2 V, the amount of accumulated charges is reduced, and therefore the memory cell capacitor is required to have a sufficiently great capacitance value.

From the viewpoints as described above, the memory cell capacitor in a DRAM is required to have a substantially constant capacitance (30–35 fF) irrespective of the integration degree. Meanwhile, the area occupied by an array and, therefore, the area occupied by a memory cell are reduced with increase in storage capacity and/or the integration degree of a DRAM. More specifically, the memory cell capacitor has a sufficiently large capacitance with a small occupying area in a DRAM, and therefore it is a capacitor with extremely high area efficiency.

Figure 3:
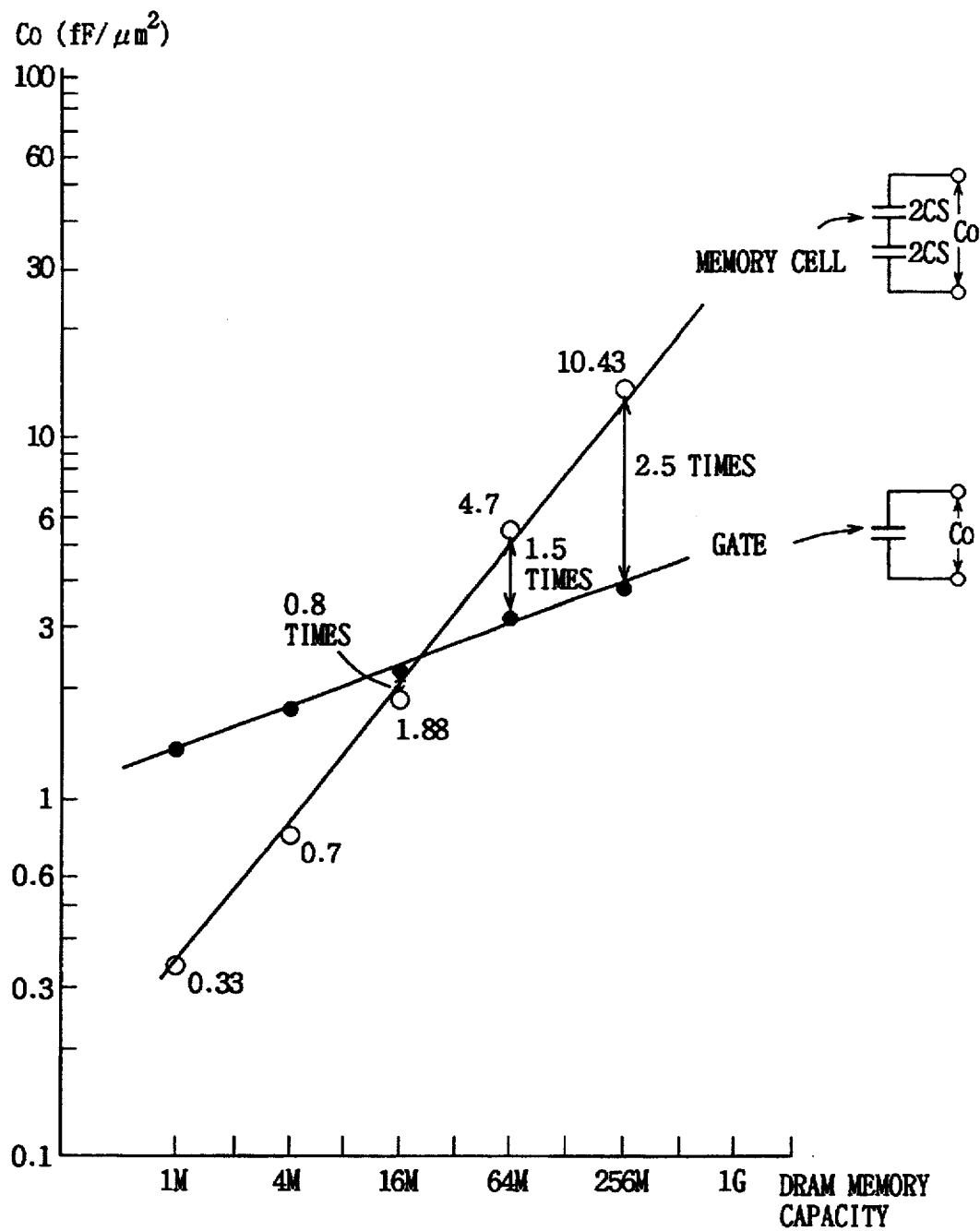
FIG. 3 shows relationship between the capacitance values of a DRAM cell capacitor and a normal MOS capacitor.

FIG. 3 shows capacitance values of a memory cell capacitor and a normal capacitor utilizing an MOS transistor. In FIG. 3, the horizontal axis shows the memory capacity of a DRAM and the vertical axis shows the capacitance value (fF) per unit area (μm²). According to the conventional art, an MOS transistor having the same structure (in terms of the thickness, quality and structure of a gate insulating film) as an MOS transistor used in a peripheral circuit, a logic circuit, or the like is employed as a decoupling capacitor. The gate insulating film of the MOS transistor of a peripheral circuit or a logic circuit is relatively thick because the gate thereof receives power supply voltage VCC. Accordingly, FIG. 3 shows capacitance value C0 of the capacitor employing an MOS transistor which is a component of a peripheral circuit or a logic circuit. In a memory cell capacitor, the capacitor insulating film (dielectric film) is made sufficiently thin so as to achieve a sufficiently great capacitance with a small occupying area. In a memory cell capacitor, the cell plate potential is set at intermediate voltage VCC/2 (VCP) as shown in FIG. 1. Therefore, electric field of VCC/2 is applied across the memory cell capacitor. The decoupling capacitor receives voltage VCC. Consequently, if a memory capacitor is used as a decoupling capacitor, two memory cell capacitors Cs must be connected in series for use to increase the breakdown voltage. Therefore, a relationship of Co=CS/4 is satisfied if a memory cell capacitor is used. In other words, capacitance value CS of the actual memory cell capacitor and the area thereof is twice as great as the value shown in the vertical axis of FIG. 3.

As shown in FIG. 3, the capacitance values of both of the gate capacitor employing an MOS transistor of a peripheral circuit or a logic circuit and the memory cell capacitor increase as the memory capacity of a DRAM increases. FIG. 3 shows capacitance value Co per unit area μm². In a gate capacitor employing an MOS transistor, the thickness of the gate insulating film and channel length/width are scaled down in accordance with the scaling rule. Accordingly, although the capacitance value is increased with high integration, the degree of increase is relatively small. On the other hand, since the memory cell capacitor achieves substantially the same capacitance even if the occupying area is reduced with an increase in a memory capacity, the capacitance thereof increases rapidly as compared with a gate capacitor with an increase in memory capacity of a DRAM.

For example, the capacitor employing a memory cell capacitor has a capacitance value approximately 1.5 times, approximately 2.5 times as great as the gate capacitor in a 64M bit DRAM and a 256M bit DRAM, respectively. However, in a 16M bit DRAM, the capacitor employing a memory cell capacitor has a smaller capacitance value than that employing the gate capacitor. That is, in a DRAM of a generation of and after 64M bit DRAM, a capacitor employing a memory cell capacitor has superior area efficiency to that employing the gate capacitor and the difference in capacitance value between the two is sharply enlarged as the memory capacity of the DRAM increases. The present invention realizes a capacitance element with excellent area efficiency making an effective use of such advantageous characteristic of the memory cell capacitor over the gate capacitor.

[Memory Cell Structure]

Figure 4:
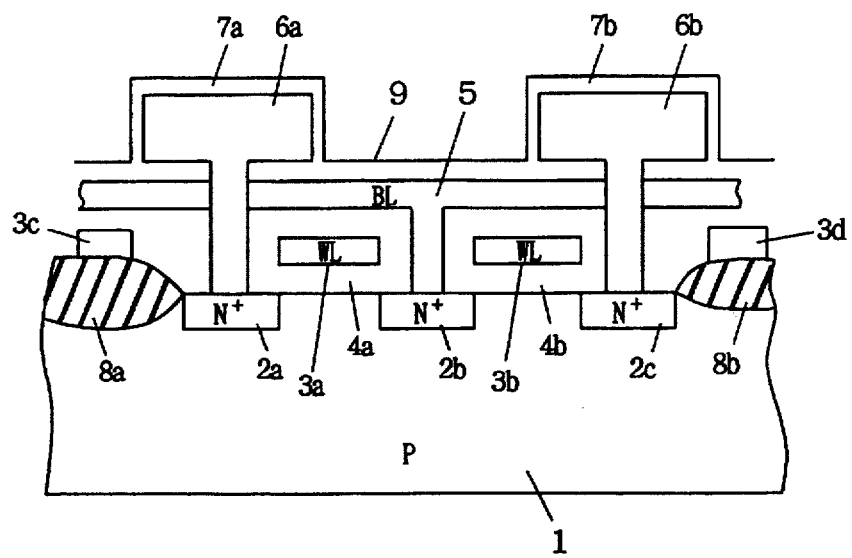
FIG. 4 schematically shows a cross sectional structure of a memory cell included in the semiconductor device to which the present invention is applied.

The memory cell structure of a DRAM, one of the semiconductor devices to which the present invention is applied, includes a memory cell capacitor with a stacked capacitor structure. Any of fin type, cylindrical type, and T-shape structures can be used for the stacked capacitor. The structure in which an electrode layer forming a storage node has a spherical and uneven surface can be used. The present invention is also applicable to a DRAM including a memory cell which has a trenched capacitor rather than a stacked capacitor as a memory cell capacitor. FIG. 4 shows a typical structure of a memory cell including a T-shape stacked capacitor.

Referring to FIG. 4, a plurality (three) of high concentration N type impurity regions 2a, 2b and 2c are arranged on a surface of a P type semiconductor substrate region 1, spaced apart from one another. Semiconductor substrate region 1 can be a semiconductor substrate itself, or an epitaxial layer or a well region. Semiconductor substrate region 1 may have any structure which has a function as a substrate for memory cells.

A gate electrode layer (word line) 3a patterned to have a prescribed shape is disposed between impurity regions 2a and 2b on the surface of semiconductor substrate region 1 with a gate insulating film 4a interposed therebetween. A gate electrode layer 3b (word line) is disposed between impurity regions 2b and 2c on the surface of semiconductor substrate region 1 with a gate insulating film 4b interposed therebetween. Gate electrode layers 3a and 3b are formed of polysilicon with low resistance having impurity doped thereto. As will be described in detail, memory cells are arranged in a matrix of rows and columns, and gate electrode layers 3a and 3b are arranged corresponding to respective rows and connected to the memory cells of the corresponding rows.

A conductive layer (sixth conductive layer) 6a forming a storage node of the memory cell capacitor is arranged at impurity region 2a, and a conductive layer (sixth conductive layer) 6b forming a storage node with a T-shaped cross section is formed at impurity region 2c. Conductive layers 6a and 6b serving as storage nodes are formed of polysilicon with low resistance having impurity doped thereto. Conductive layers 6a and 6b are electrically connected to corresponding impurity regions 2a and 2c and the cross section of the upper part thereof is rectangular with a relatively great height (in order to increase the area facing a cell plate described later). Here, the phrase "electrically connected" refers to the manner in which the regions are connected to transmit electric signals. Another interconnection layer (such as a barrier layer) may be interposed therebetween or the regions may be interconnected through a switching transistor. The state where connection is made to allow communication of electric signals is referred to as the "electrically connected" state.

A conductive layer (eighth conductive layer) 5 serving as a bit line is electrically connected to impurity region 2b. Conductive layer 5 is shown being provided between gate electrode layers 3a and 3b and the upper portions of the storage node. However, conductive layer 5 serving as a bit line may be disposed over the storage node and a cell plate (described later). Conductive layer 5 serving as a bit line may have a composite structure of polysilicon and refractory metal such as tungsten or a refractory metal silicide structure. Conductive layer 5 is arranged to extend in the column direction of the memory cells and correspond to each column, and connected to the memory cells in the corresponding column.

Element isolation films 8a and 8b formed by, for example, LOCOS films (LOCally Oxidized Silicon Film) for achieving isolation from adjacent memory cells are formed adjacent to impurity regions 2a and 2c. On element isolation films 8a and 8b, gate electrode layers (word lines) 3c and 3d arranged corresponding to other rows of memory cells are disposed.

A conductive layer (seventh conductive layer) 9 serving as a cell plate is disposed facing the surfaces of storage nodes 6a and 6b with insulating films 7a and 7b interposed therebetween. Conductive layer 9 serving as a cell plate is formed of polysilicon with low resistance into which impurity is doped. Insulating films 7a and 7b of the capacitors have two-layered structure of a silicon nitride film and silicon oxide film, and the great dielectric constant thereof contributes to an effective greater thickness of the insulator.

In FIG. 4, one memory cell is formed by impurity regions 2a and 2b, gate electrode layer 3a, storage node 6a, insulating film 7a, and cell plate 9. Another memory cell is formed by impurity regions 2b and 2c, gate electrode layer 3b, conductive layer 6b, insulating film 7b, and conductive layer 9. One impurity region 2b is shared by adjacent memory cells to achieve reduction in area occupied by the memory cells.

As apparent from the structure shown in FIG. 4, the memory cell capacitor is arranged to overlap the transistor of the memory cell, i.e. the access transistor when seen in a plan view. Such a three-dimensional cell structure reduces the area occupied by the cell. Conductive layers 6a and 6b forming storage nodes are relatively thick at the upper portion, so that the area facing conductive layer 9 serving as a cell plate is enlarged. Thus, the facing area is increased without an increase in occupying area when seen in a plan view, thereby achieving increase in capacitance value of the memory cell capacitor.

Thus, the capacitor with a stacked capacitor structure realizes excellent area efficiency. The present invention makes use of such a structure of a memory cell capacitor.

Embodiment 1

Figure 5:
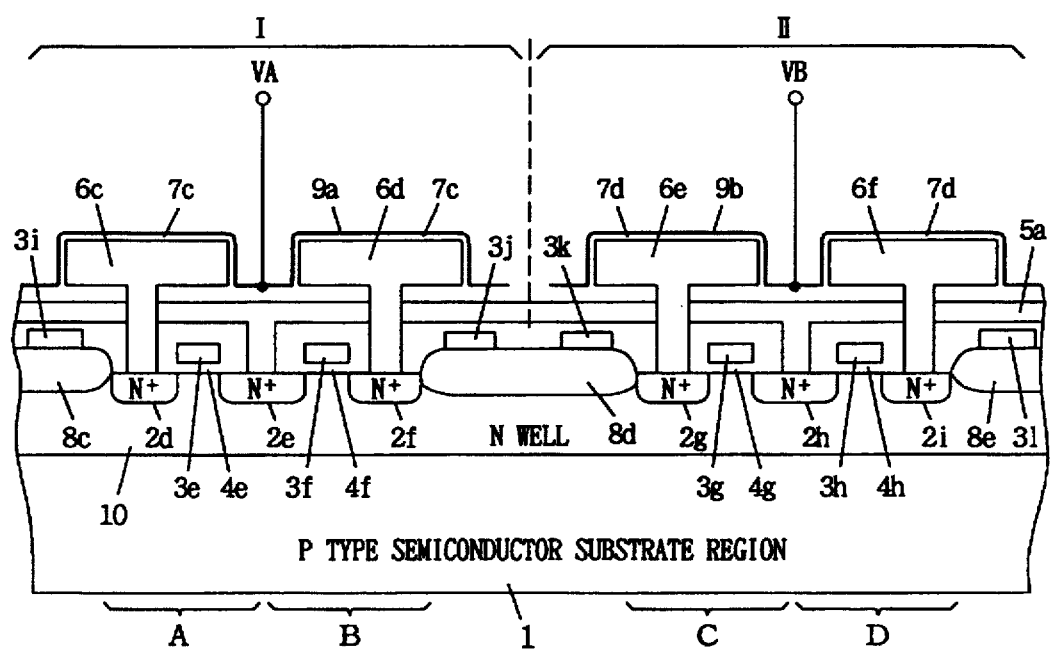
FIG. 5 schematically shows a structure of a semiconductor device according to a first embodiment of the present invention.

FIG. 5 is a diagram schematically showing a structure of a semiconductor device according to a first embodiment of the present invention. On a surface of P type semiconductor substrate region 1, an N well (N type semiconductor layer) 10 is formed as a semiconductor substrate region of a first conductivity type. With N well 10 as the substrate region, a capacitance element having the same structure as the memory cell shown in FIG. 4 is formed. More specifically, high concentration N type impurity regions 2d-2i as first impurity regions are formed at the surface of the N well, spaced apart from one another. First impurity regions 2d-2i are formed in the same process as impurity regions 2a and 2b of the memory element shown in FIG. 4. In the following description, regarding the components shown in FIGS. 4 and 5, the components shown by the same reference numeral but the different characters are formed in the same manufacturing process.

An element isolation film 8d such as a thermal oxide film for element isolation is formed between impurity regions 2f and 2g. Element isolation films 8c and 8e are formed adjacent to impurity regions 2d and 2i for isolating them from impurity regions which are not shown, respectively. A gate electrode layer 3e as a fourth conductive layer is formed between impurity regions 2d and 2e on semiconductor substrate region 10 with a gate insulating film 4e interposed therebetween. A conductive layer 3f is formed between impurity region 2e and 2f on the surface of semiconductor substrate region 10 with a gate insulating film 4f interposed therebetween. A conductive layer 3g is formed between impurity regions 2g and 2h on the surface of semiconductor substrate region 10 with a gate insulating film 4g interposed therebetween. A conductive layer 3h is formed between impurity regions 2h and 2i on the surface of semiconductor substrate region 10 with a gate insulating film 4h interposed therebetween. Similarly, conductive layers 3i, 3j, 3k and 3l are formed on element isolation films 8c, 8d, and 8e, respectively. These conductive layers 3e to 3l are formed of impurity-doped polysilicon with low resistance as gate electrode layers 3a and 3b shown in FIG. 4.

First conductive layers 6c, 6d, 6e and 6f having a T-shaped cross section are formed for preselected impurity regions (impurity regions corresponding to storage nodes of memory cells) 2d, 2f, 2g, and 2i among impurity regions 2d–2i, and these first conductive layers 6c to 6f are electrically connected to impurity regions 2d, 2f, 2g, and 2i, respectively. These conductive layers 6c to 6f have a plug portion (leg portion) for electrically connecting to corresponding impurity region 2d, 2f, 2g, or 2i, and a flat portion with a relatively large surface area for actually forming the capacitor. Conductive layers 6c–6f are formed in the same manufacturing process as conductive layers 6a and 6b forming storage nodes of memory cells shown in FIG. 4 and have the same structure (impurity-doped polysilicon). These conductive layers 6c–6f are patterned to have a predetermine shape and isolated by an interlevel insulating layer from one another.

First conductive layers 6c–6f are divided into two groups. For first conductive layers 6c and 6d in a first group, a second conductive layer 9a is formed of low-resistance polysilicon which is heavily doped with impurity, facing the surfaces of first conductive layers 6c and 6d with an insulating film (first insulating film) 7c interposed therebetween. For first conductive layers 6e and 6f in a second group, a third conductive layer 9b with low resistance which is heavily doped with impurity is formed facing the surfaces of first conductive layers 6e and 6f with a second insulating film 7d interposed therebetween. Conductive layers 9a and 9b are electrically isolated from each other. Second conductive layer 9a is electrically connected to one electrode node VA, while third conductive layer 9b is connected to the other electrode node VB.

A fifth conductive layer 5a extending in a horizontal direction of the figure is electrically connected to impurity regions (impurity regions in a third group) 2e and 2h. Fifth conductive layer 5a corresponds to bit line 5 of the memory cells shown in FIG. 4 and is formed of refractory metal silicide or the like.

In the structure shown in FIG. 5, as apparent from the comparison with FIG. 4, two memory cells A and B are formed in a region I, and two memory cells C and D are formed in a region II. In a conventional structure of the memory cell, all the cell plate electrode layers are interconnected to form a common electrode of the memory cell capacitors. In the structure shown in FIG. 5, second conductive layer 9a corresponding to the cell plate provided in region I and conductive layer 9b formed in region II are isolated from each other. First impurity regions 2d–2i are electrically interconnected through N well 10 which is a semiconductor substrate region. Therefore, the capacitors formed by elements A and B are connected in parallel to each other, and the capacitors formed by elements C and D are connected in parallel to each other, and the sets of capacitors connected in parallel are serially connected to each other. As a result, a decoupling capacitor can be implemented by connecting electrode nodes VA and VB to a power supply node (power supply line) and a ground node (ground line), respectively.

Elements A–D have the same structure as the memory cell and the area occupied by these elements is sufficiently reduced. The capacitor insulating films 7c and 7d have the same two-layered structure of a silicon nitride film and a silicon oxide film as capacitor insulating films 7a and 7b of the memory cell, so that a sufficiently great capacitance value can be achieved with small occupying area.

Since elements A–D have the same structure as the memory cell, respective conductive layers and impurity regions can be formed by the same steps of manufacturing the corresponding elements of the memory cell except for N well 10, whereby a capacitor with excellent area efficiency can be implemented in a DRAM without an increase in number of manufacturing steps.

Figure 6:
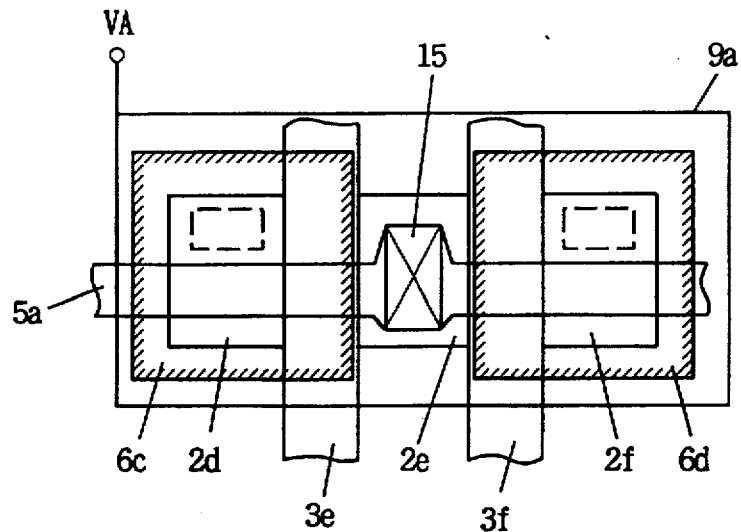
FIG. 6 is a plan view showing a layout of the semiconductor device according to the first embodiment of the present invention.

FIG. 6 is a plan view showing the layout of the capacitance elements shown in FIG. 5. In FIG. 6, the layout of a portion corresponding to elements A and B in FIG. 5 are shown. Referring to FIG. 6, conductive layer 3e is disposed between impurity regions 2d and 2e, and conductive layer 3f is arranged between impurity regions 2e and 2f. Impurity region 2e is electrically connected to conductive layer 5a serving as a bit line through a contact hole 15. Conductive layers 3e and 3f and conductive layer 5a are disposed in the direction orthogonal to each other. This is because the capacitance element has the same structure as the memory cell and conductive layers 3e and 3f correspond to the word lines and conductive layer 5a corresponds to a bit line as described above.

Conductive layers 6c and 6a are electrically connected to impurity regions 2d and 2f through plug portions shown by a broken line, respectively. Conductive layer 9a is disposed on conductive layers 6c and 6d. Conductive layers 6c and 6d forming electrode nodes of the capacitors extend over conductive layers 3e and 3f. As shown in FIG. 5, the upper flat portions of conductive layers 6c and 6d are thick, resulting in a sufficiently large surface area at the side thereof. As a result, the area in which conductive layer 9a and conductive layers 6c and 6d face each other is sufficiently large. Thus, a capacitor can be obtained which has the characteristic of the memory cell capacitor in a DRAM to realize a great capacitance value with a small occupying area. A required number of capacitance elements shown in FIG. 6 are arranged in row and column directions similarly to the arrangement of an array of memory cells.

Figure 7A:
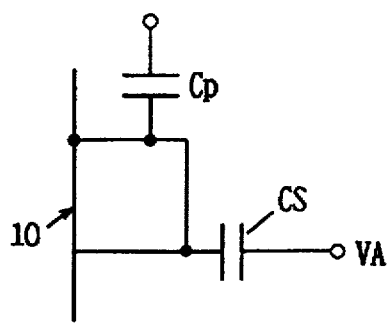
FIG. 7A shows a capacitor provided by one capacitance element and FIG. 7B shows an electrically equivalent circuit of the capacitor according to the first embodiment of the present invention.
Figure 7B:
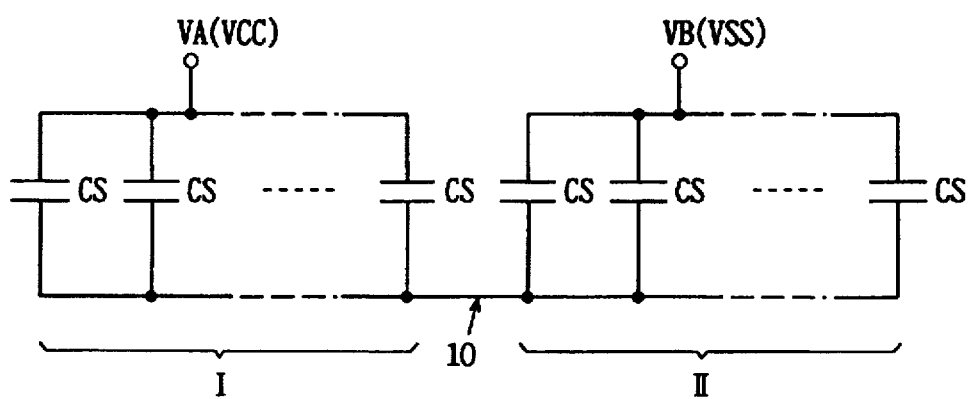

FIGS. 7A and 7B are diagrams showing electrically equivalent circuits of one element and the capacitor according to the present invention, respectively. Referring to FIG. 7A, one capacitance element includes a capacitor CS formed by conductive layer 9a and conductive layer 6 (6c–6f) and a capacitor Cp formed by conductive layer 3 (3e–3h) and semiconductor substrate region 10. The capacitors Cp and CS are connected in parallel to semiconductor substrate region 10. One electrode of capacitor CS is connected to node VA. Conductive layer 3 (3e–3h) forming capacitor Cp may be in a floating state or may be fixedly connected to a constant potential as will be described later. Capacitor Cp corresponds to a gate capacitor of an access transistor of a memory cell. Therefore, the breakdown voltage of capacitor Cp exceeds power supply potential VCC, and reliability is not impaired by fixedly applying power supply voltage VCC to conducive layer 5. However, the memory cell capacitor CS has a sufficiently thin insulating film and the breakdown voltage thereof is small. By connecting capacitors CS in series between nodes VA and VB, the voltage between nodes VA and VB is capacitively divided. When power supply voltage VCC is applied to power supply node VA and ground voltage VSS is applied to power supply node VB, the capacitor CS receives only the voltage of VCC/2, and therefore the reliability is not impaired.

Referring to FIG. 7B, a plurality of capacitors CS are connected in parallel between power supply node VA and semiconductor substrate region 10. A plurality of capacitors CS are also connected in parallel between power supply node VB and semiconductor substrate region 10. FIG. 7B does not show capacitor Cp since it is small in capacitance as compared to capacitor CS. As shown in FIG. 7B, when power supply voltage VCC and ground voltage VSS are applied to nodes VA and VB, respectively, a voltage of VCC/2 is applied between node VA and semiconductor substrate region 10, and voltage VCC/2 is applied between node VB and semiconductor substrate region 10. It should be noted that the description above applies to the case where the number of capacitance elements included in region I is equal to that in region II. Assuming that the number of capacitance elements included in each of regions I and II is X, regions I and II each provide the capacitance value of X·CS. Therefore, the capacitance value between power supply nodes VA and VB is X·CS/2 since two sets of capacitors X·CS are connected in series.

Figure 8:
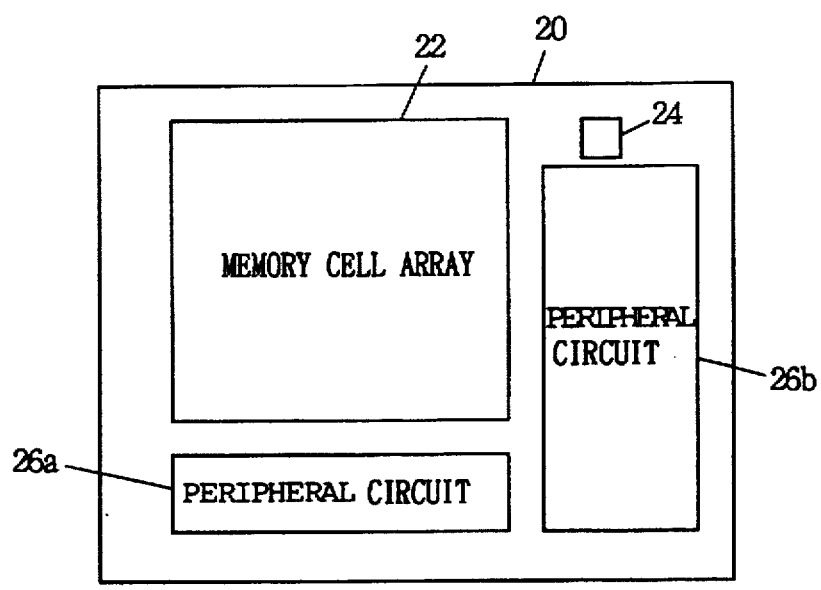
FIG. 8 schematically shows the entire arrangement of the semiconductor device according to the present invention.

FIG. 8 is a diagram schematically showing the entire arrangement of a DRAM according to the present invention. Referring to FIG. 8, a DRAM 20 includes a memory cell array 22 having DRAM memory cells arranged in a matrix of rows and columns, and peripheral circuits 26a and 26b for controlling refresh of memory cell data and input/output of data to/from memory cell array 22. Peripheral circuits 26a and 26b include a data input/output circuit, an address input circuit, an external control signal input circuit, an internal control signal generation circuit, and an address decode circuit. A capacitor 24 formed in accordance with the present invention is arranged at an appropriate position of DRAM 20. Capacitor 24 is located near the circuit portion with a great likelihood of generating voltage noise.

Peripheral circuits 26a and 26b include an n channel MOS transistor and a p channel MOS transistor. They have CMOS structure for reduction in power consumption.

Figure 9A:
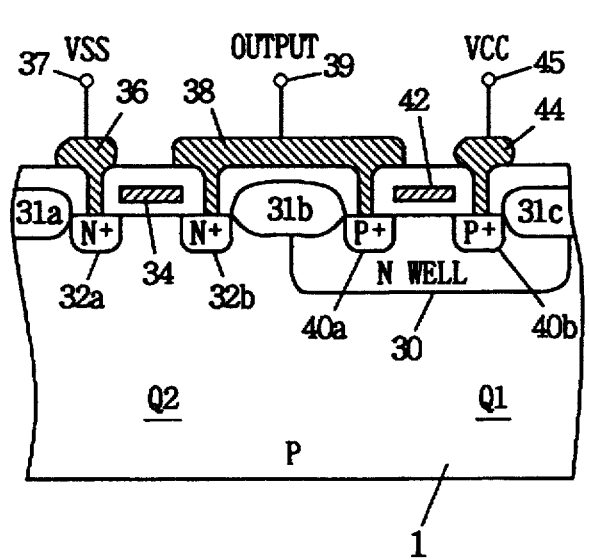
FIG. 9A shows a structure of a gate included in a peripheral circuit and FIG. 9B shows an electrically equivalent circuit of the logic gate.
Figure 9B:
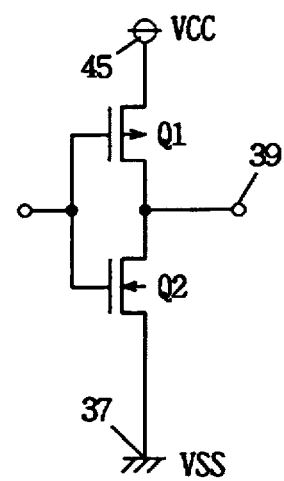

FIG. 9A shows an example of a structure of a CMOS circuit included in peripheral circuit 26a or 26b and FIG. 9B shows an electrically equivalent circuit thereof. Referring to FIG. 9A, an N well 30 is formed at the surface of P type semiconductor substrate region 1. A p channel MOS transistor is formed in N well 30 region. Element isolation films 31b and 31c for isolating elements are formed at the peripheral portions of N well 30. Similarly, an element isolation film 31a for isolation from adjacent components is arranged in the peripheral circuits. High concentration N type impurity regions 32a and 32b are formed between element isolation films 31a and 31b at the surface of semiconductor substrate region 1, spaced apart from each other. A gate electrode layer 34 is formed between impurity regions 32a and 32b on the surface of the substrate region with a gate insulating film interposed therebetween. Impurity region 32a is electrically connected to a ground node 37 through an electrode interconnection 36. Impurity region 32b is electrically connected to an output node 39 through an electrode interconnection 38.

At the surface of N well 30, high concentration P type impurity regions 40a and 40b are formed, spaced apart from each other. Impurity region 40a is electrically connected to electrode interconnection 38. Impurity region 40b is electrically connected to a power supply node 45 through an electrode interconnection 44. A gate electrode layer 42 is formed between impurity regions 40a and 40b on the surface of N well 30 with a gate insulating film interposed therebetween. Gate electrode layers 34 and 42 receive a signal from the portion which is not shown. A p channel MOS transistor Q1 is formed by impurity regions 40a and 40b formed in N well 30 and electrode layer 42, and an n channel MOS transistor Q2 is formed by P type semiconductor substrate region 1, impurity regions 32a and 32b and gate electrode 34. MOS transistors Q1 and Q2 form a CMOS inverter as shown in FIG. 9B. More specifically, p channel MOS transistor Q1 is connected between power supply node 45 and output node 39, while n channel MOS transistor Q2 is connected between output node 39 and ground node 37. MOS transistors Q1 and Q2 receive an input signal from the unshown portion in common at their gates.

If a peripheral circuit has a CMOS structure as shown in FIG. 9A, N well 30 is formed for producing a p channel MOS transistor. N well 10 serving as a substrate region shown in FIG. 5 is formed by the same step as that for forming N well 30.

In a DRAM, a memory cell and a peripheral circuit are formed in parallel for reduction in number of steps. Generally, an N well for forming a p channel MOS transistor in peripheral circuits is formed before an impurity region for an access transistor of a memory cell is formed. Therefore, the manufacturing steps are not increased because the N well of the peripheral circuit and N well 10 for formation of the capacitance element are formed through the same steps. Even in a structure where N well 30 for the p channel MOS transistor of the peripheral circuit is formed after the impurity regions for forming the access transistor of the memory cell and the n channel MOS transistor of the peripheral circuit are formed, no problem is generated if the N well is formed by implanting N type impurity ions after forming the impurity region in the capacitance element, which merely results in increase in impurity concentration of the impurity region, because these first impurity regions are electrically interconnected.

As described above, according to the first embodiment of the present invention, a plurality of capacitors having the same structure as the memory cell capacitor are provided and divided into first and second groups, the cell plate electrodes are electrically divided in accordance with such division into the groups, and impurity regions are electrically connected to the substrate region, so that a capacitor with excellent area efficiency can be implemented without impairing the dielectric breakdown voltage characteristics.

Embodiment 2

Figure 10:
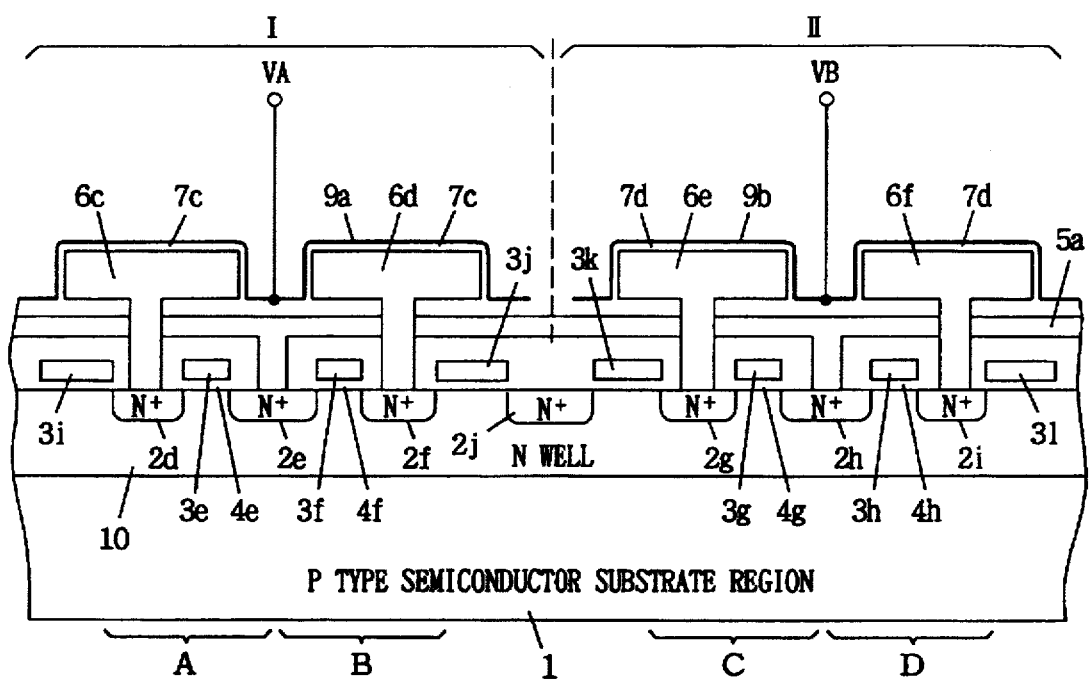
FIG. 10 schematically shows a structure of a semiconductor device according to a second embodiment of the present invention.

FIG. 10 is a diagram schematically showing a structure of a semiconductor device according to a second embodiment of the present invention. In the structure shown in FIG. 10, element isolation films 8c–8e shown in FIG. 5 are not provided. A high concentration N type impurity region 2j is formed at the surface of N well 10 in the boundary area between regions I and II. Conductive layers 3i–3l formed on element isolation films (field isolation films) 8c–8e are disposed on the surface of N well 10 with a gate insulating film interposed therebetween, similarly to other conductive layers 3e–3h. The rest of the structure is the same as that shown in FIG. 5, and therefore corresponding portions are labeled with the identical reference numerals and description thereof will not be repeated.

Since impurity region 2j takes the place of the element isolation film, the surface resistance of N well 10 can be reduced and electrical connection between the capacitors formed in regions I and II can be realized with reduced resistance.

Element isolation films are used for isolating memory cells. In the present embodiment, all the impurity regions formed at the surface of N well 10 are electrically connected. Therefore, removal of such element isolation films does not cause any problems. In addition, an element isolation film has a greater thickness than the gate insulating film. Consequently, the distance between conductive layers 3i, 3j, 3k and 3l and N well 10 can be reduced, leading to an increase in capacitance value of the capacitors formed between these conductive layers 3i–3l and N well 10.

Figure 11:
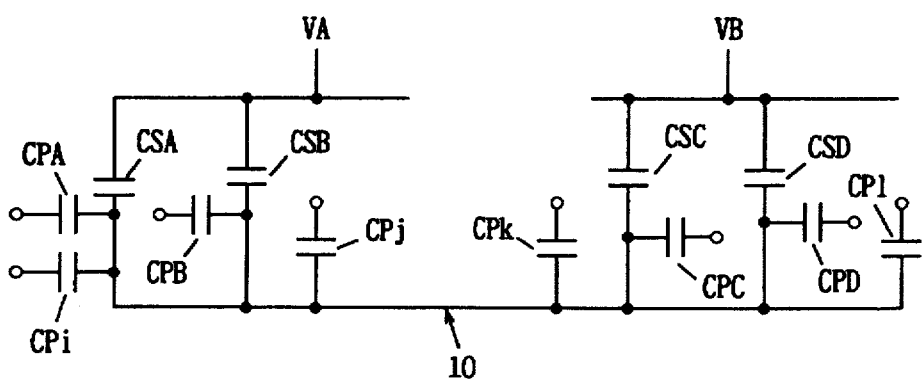
FIG. 11 shows an electrically equivalent circuit of the semiconductor device shown in FIG. 10.

FIG. 11 is a diagram showing an electrically equivalent circuit of the semiconductor device shown in FIG. 10. Referring to FIG. 11, a capacitor CSA provided by element A and a capacitor CSB provided by element B are connected in parallel to each other between node VA and substrate region 10. Capacitors CPA and CPB provided by conductive layers 3e and 3f are connected in parallel to capacitors CSA and CSB, respectively. Since the element isolation films are removed from semiconductor substrate region 10, capacitors CPi, CPj and CPk are connected to substrate region 10 due to conductive layers 3i, 3j and 3k. Capacitor CSC and CSD provided by elements C and D are connected between substrate region 10 and node VB. Capacitors CPC and CPD provided by conductive layers 3g and 3h are connected to capacitors CSC and CSD. Capacitor CPl is connected to substrate region 10 due to conductive layer 3l.

As apparent from FIG. 11, element isolation films are removed to reduce the distance between conductive layers 3i–3l and N well 10, the capacitance values of capacitors CPi, CPj, CPk and CPl are increased. Since these capacitors are connected in parallel to N well 10, the capacitance value between nodes VA and VB is increased, thereby allowing implementation of a capacitor having a high capacitance value with a small occupying area.

Embodiment 3

Figure 12:
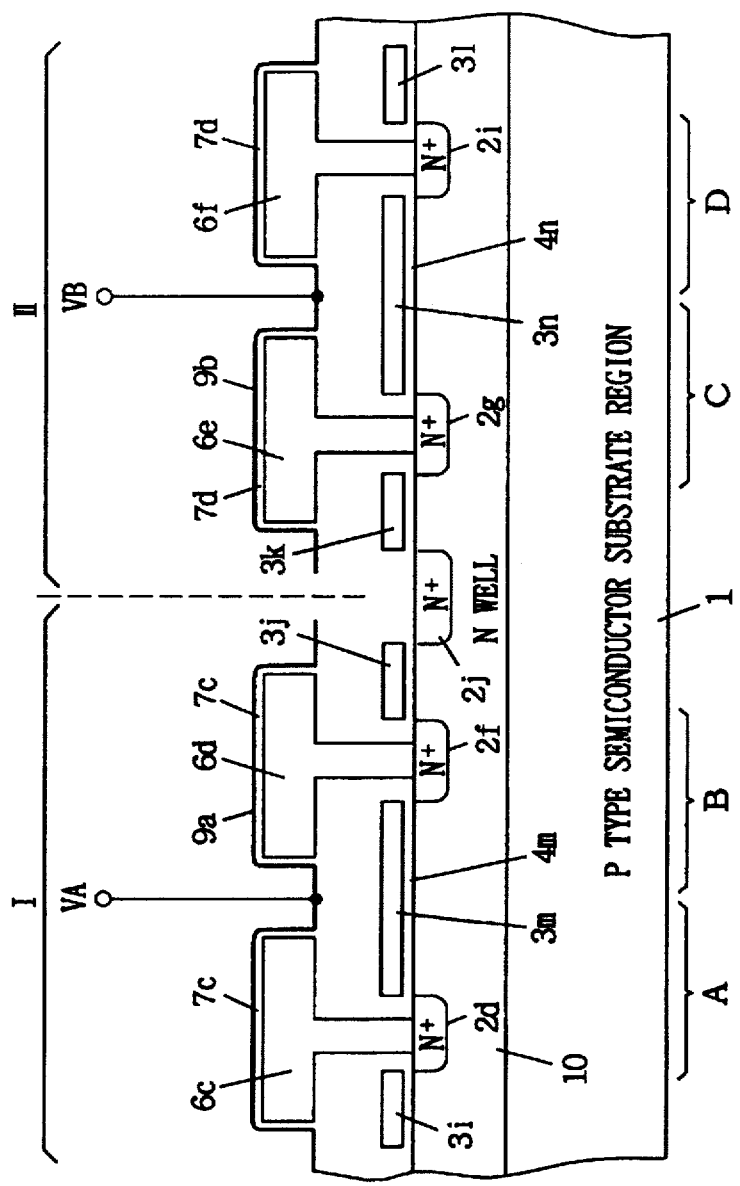
FIGS. 12–14 schematically show structures of semiconductor devices according to third through fifth embodiments of the present invention, respectively.

FIG. 12 schematically shows a structure of a semiconductor device according to a third embodiment of the present invention. Fifth conductive layer 5a corresponding to a bit line is not provided in the structure shown in FIG. 12. Similarly, the impurity region connected to the fifth conductive layer corresponding to a bit line is not provided accordingly. Therefore, the distance between impurity regions 2d and 2f connected to conductive layers 6c and 6d which correspond to storage nodes is increased, and in region II as well, the distance between impurity regions 2g and 2i connected to conductive layers 6e and 6f which correspond to storage nodes is increased. A conductive layer 3m is disposed between impurity regions 2d and 2f on N well 10 with a gate insulating film 4m interposed therebetween. In region II as well, a conductive layer 3n is disposed between impurity regions 2g and 2i on the surface of N well 10 with a gate insulating film 4n interposed therebetween. The rest of the structure is the same as that shown in FIG. 10 and is labeled with the identical reference numerals, and detailed description thereof will not be repeated.

According to the structure shown in FIG. 12, the impurity regions connected to the fifth conductive layer corresponding to a bit line are not provided, and conductive layers 3m and 3n are disposed to extend over the regions. As a result, as compared to the structure shown in FIG. 10, the capacitance value of the capacitor formed by conductive layer 3m, gate insulating film 4m and N well 10 is greater than the sum of the capacitance values of the capacitor formed by conductive layer 3e, gate insulating film 4e and N well 10 and the capacitor formed by conductive layer 3f, gate insulating film 4f and N well 10 shown in FIG. 10. Thus, the capacitor having a greater capacitance value than the sum of the capacitance values of capacitors CPA and CPB in FIG. 11 is connected to N well 10, and the capacitor having a greater capacitance value than the sum of the capacitance values of capacitors CPC and CPD is connected to N well 10. Consequently, the capacitance value between nodes VA and VB is further increased, thereby achieving a capacitor having a greater capacitance value with a small occupying area.

Impurity region 2j is provided at the boundary area between regions I and II, and in this area conductive layers 3j and 3k are similar in shape to the gate electrode layers (word lines) of the memory cell. Thus, the capacitance value formed by the elements in region I can be made equal to that formed by the components in region II, resulting in equalization of the capacitance value of capacitors in the capacitance divider in the other embodiments described hereinafter. However, impurity region 2j can be removed and conductive layer 3 (3j, 3k) can be provided to extend on the surface of N well 10 between impurity regions 2f and 2g.

As described above, according to the third embodiment, the impurity region connected to the conductive layer which corresponds to a bit line is eliminated and a conductive layer corresponding to a word line extends over that region as well, so that the capacitance between the conductive layer and the semiconductor substrate region (N well) is further increased, thereby achieving a capacitor with a greater capacitance value.

Embodiment 4

Figure 13:
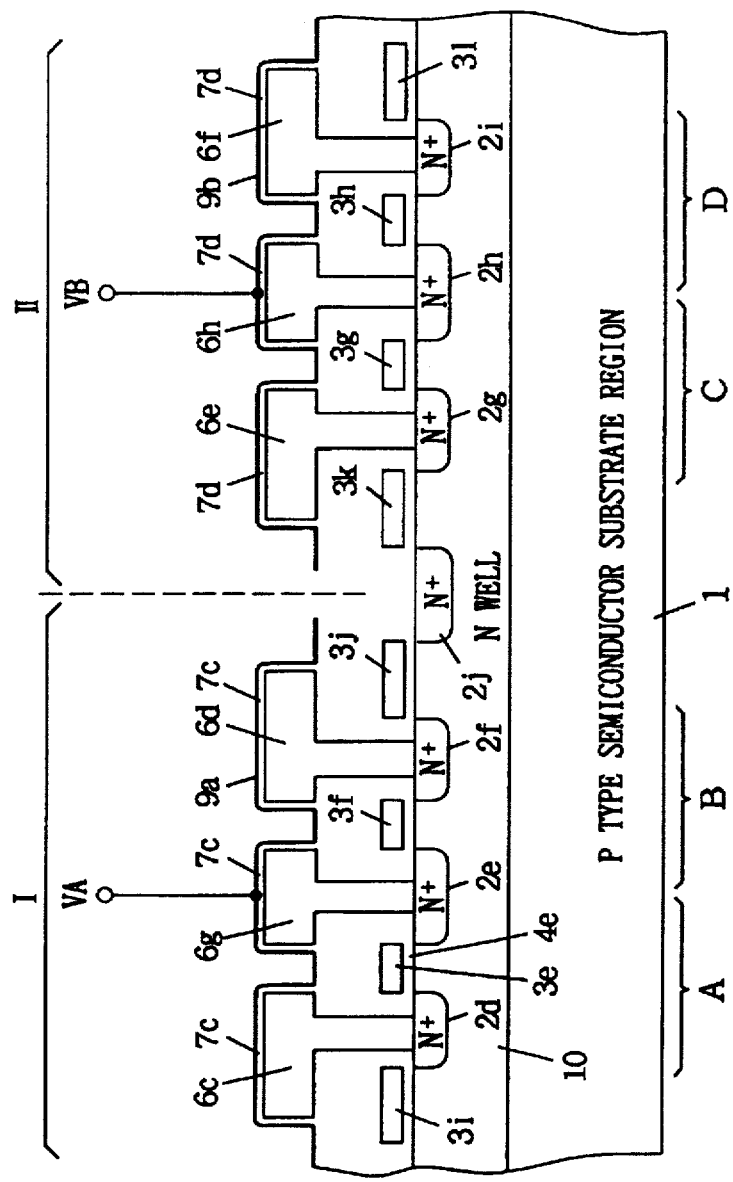

FIG. 13 schematically shows a structure of a semiconductor device according to a fourth embodiment of the present invention. The conductive layer corresponding to a bit line is not disposed also in the fourth embodiment. Conductive layers 6g and 6h corresponding to storage nodes are provided for impurity regions 2e and 2h connected to the conductive layer corresponding to a bit line, respectively. Conductive layers 6g and 6h have a plug portion (leg portion) electrically connected to the corresponding impurity regions 2e and 2h, and a flat portion for forming capacitors at the surface. Conductive layer 9a is arranged to face the surface of conductive layers 6c, 6d and 6g with insulating film 7c interposed therebetween. Conductive layer 9b is arranged to face the surface of conductive layers 6e, 6f and 6h with insulating film 7d interposed therebetween. The rest of the structure is the same as that shown in FIG. 10, and the corresponding portions are labeled with the identical reference numerals.

In the structure shown in FIG. 13, the conductive layers corresponding to storage nodes facing conductive layer 9a has an increased surface area by conductive layers 6g and 6h. In this case, the area at the flat portions of conductive layer 6c and 6d is reduced a little because conductive layer 6g is additionally inserted therebetween. However, such reduction in area of the surface of the conductive layers 6c and 6d is compensated for by the surface area of the flat portion of the inserted conductive layer 6g, and conductive layer 9a is arranged to face the side surface area of the flat portion of conductive layer 6g, whereby the capacitance value is increased by the surface area at the side of the flat portion of conductive layer 6g. The same applies to conductive layer 6h. Therefore, since the conductive layer corresponding to the storage node is connected to the impurity region connected to the conductive layer corresponding to a bit line and is used as a capacitor, a capacitor with a greater capacitance value can be realized without an increase in area occupied by the capacitor.

Embodiment 5

Figure 14:
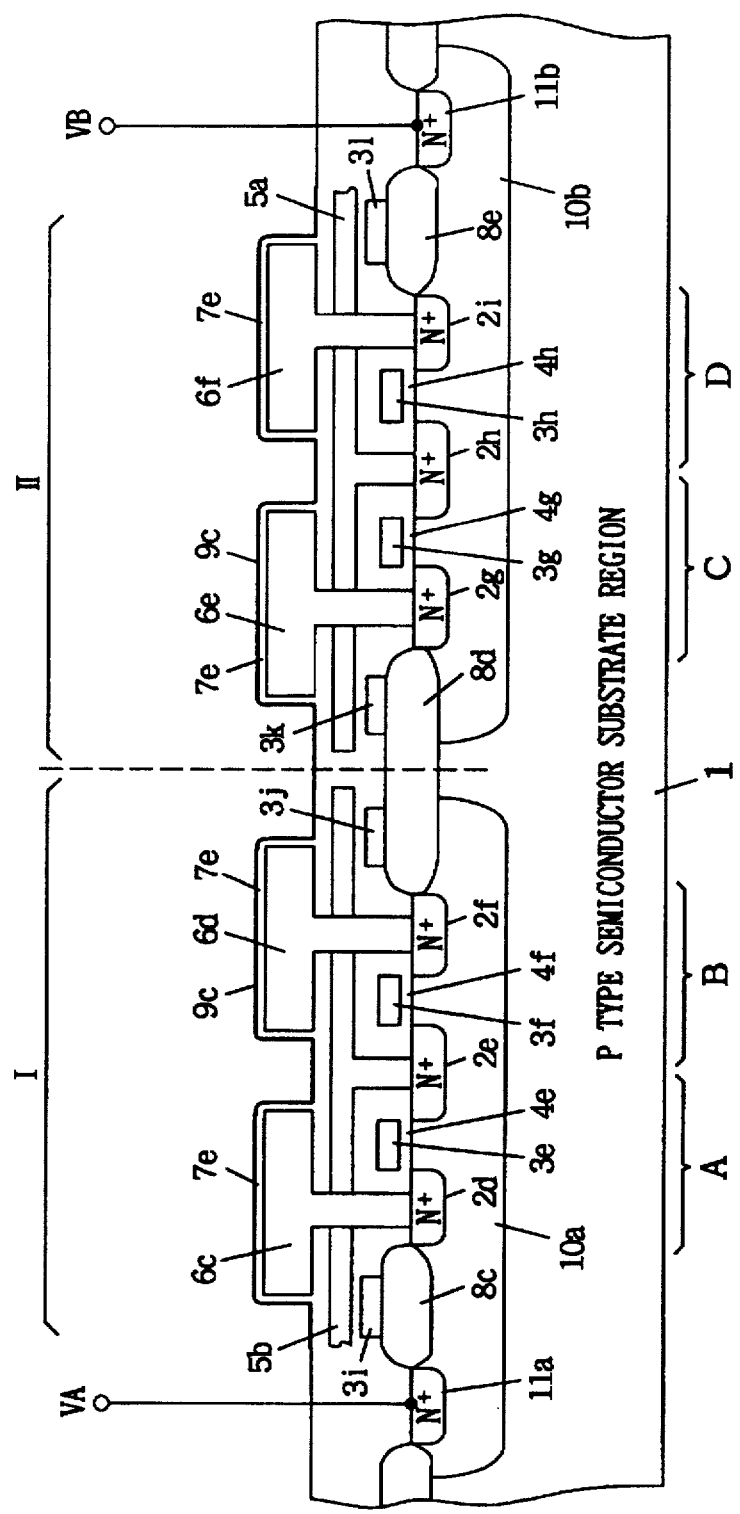

FIG. 14 schematically shows a structure of a semiconductor device according to a fifth embodiment of the present invention. Referring to FIG. 14, N type wells 10a and 10b are formed corresponding to regions I and II at the surface of P type semiconductor substrate region 1. N type wells 10a and 10b are arranged to be electrically isolated from each other. Element isolation film 8d is formed at the boundary area between N wells 10a and 10b.

Impurity regions 2d–2f are formed at N well 10a. Conductive layers 6c and 6d corresponding to storage nodes are formed at impurity regions 2d and 2f, respectively. Conductive layer 5a corresponding to a bit line is electrically connected to impurity region 2e.

At the surface of N well 10a, a high concentration N type impurity region 11a is arranged electrically isolated from impurity region 2d by element isolation film 8c. Impurity region 11a is connected to node VA.

At N well 10b, impurity regions 2g, 2h, 2i similar to the impurity regions of the memory cell are formed at the surface thereof, spaced apart from each other. Conductive layers 6e and 6f corresponding to storage nodes are electrically connected to impurity regions 2g and 2i. Conductive layer 5a corresponding to a bit line is electrically connected to impurity region 2h.

In N well 10b, a high concentration N type impurity region 11b is further formed electrically isolated from impurity region 2i by element isolation film 8e. Impurity region 11b is electrically connected to electrode node VB. Impurity regions 11a and 11b are formed in the same manufacturing steps as impurity regions 2d–2i. Conductive layers 3i, 3j, 3k and 3l corresponding to word lines formed at the surfaces of element isolation films 8c, 8d and 8e.

A conductive layer 9c corresponding to a cell plate is arranged to face the surface of conductive layers 6c, 6d, 6e and 6f corresponding to storage nodes with an insulating film 7e similar to the capacitor insulating film of the memory cell interposed therebetween.

Figure 15:
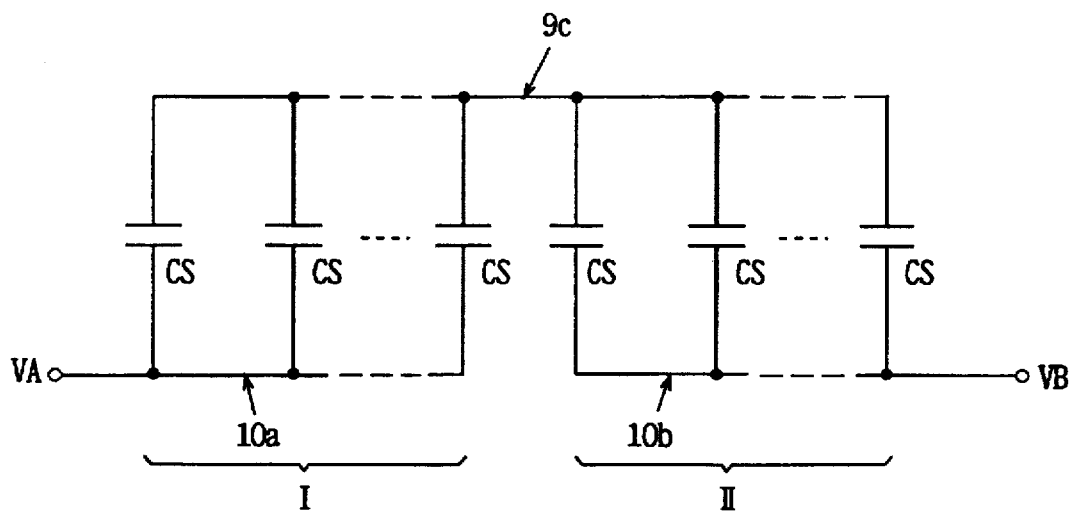
FIG. 15 shows an electrically equivalent circuit of the semiconductor device shown in FIG. 14.

FIG. 15 is a diagram showing an electrically equivalent circuit of the semiconductor device shown in FIG. 14. Referring to FIG. 15, N well 10a forms one electrode node of a capacitor, and N well 10b forms the other electrode node thereof. Conductive layer 9c interconnects respective one-side electrodes (corresponding to storage nodes) of the capacitance elements (corresponding to memory cell capacitors) forming a capacitor. N wells 10a and 10b each have an inherent resistance value.

In the structure shown in FIG. 15, the N well is reduced in length and the resistance value between electrode node VA and the electrode (impurity region) of each capacitance element is reduced, leading to a reduction in voltage drop at the region, as compared to the embodiments described above. The same applies to the connection between N well 10b and electrode node VB. Conductive layer 9c has a smaller resistance value than the N well. Therefore, the effects of the decrease of voltage caused by the resistance component can be eliminated, so that charges are supplied/absorbed at a high speed at regions I and II without an RC delay when voltage noise is generated.

As described above, according to the fifth embodiment, the capacitance elements having the same structure as the memory cell capacitors are formed in well regions electrically isolated from each other and the common electrodes of the capacitance elements are connected in common and the wells provided separately are used as electrodes of the capacitance elements, thereby implementing the capacitance element with excellent frequency characteristics with reduced resistance components (without a delay) and excellent area efficiency. Conductive layer 5a corresponding to a bit line is provided in the structure shown in FIG. 14. Conductive layer 5a is assumed to have a greater resistance value than N wells 10 and 10b and conductive layer 9c. Therefore, conductive layer 5a prevents electrical connection between N wells 10a and 10b.

When conductive layer 5 (5a, 5b) has a sufficiently small resistance value, layer 5 (5a, 5b) is provided only within the corresponding regions and isolated at the boundary area between regions r and II. Thus, N wells 10a and 10b are completely isolated in a DC fashion.

Embodiment 6

Figure 16:
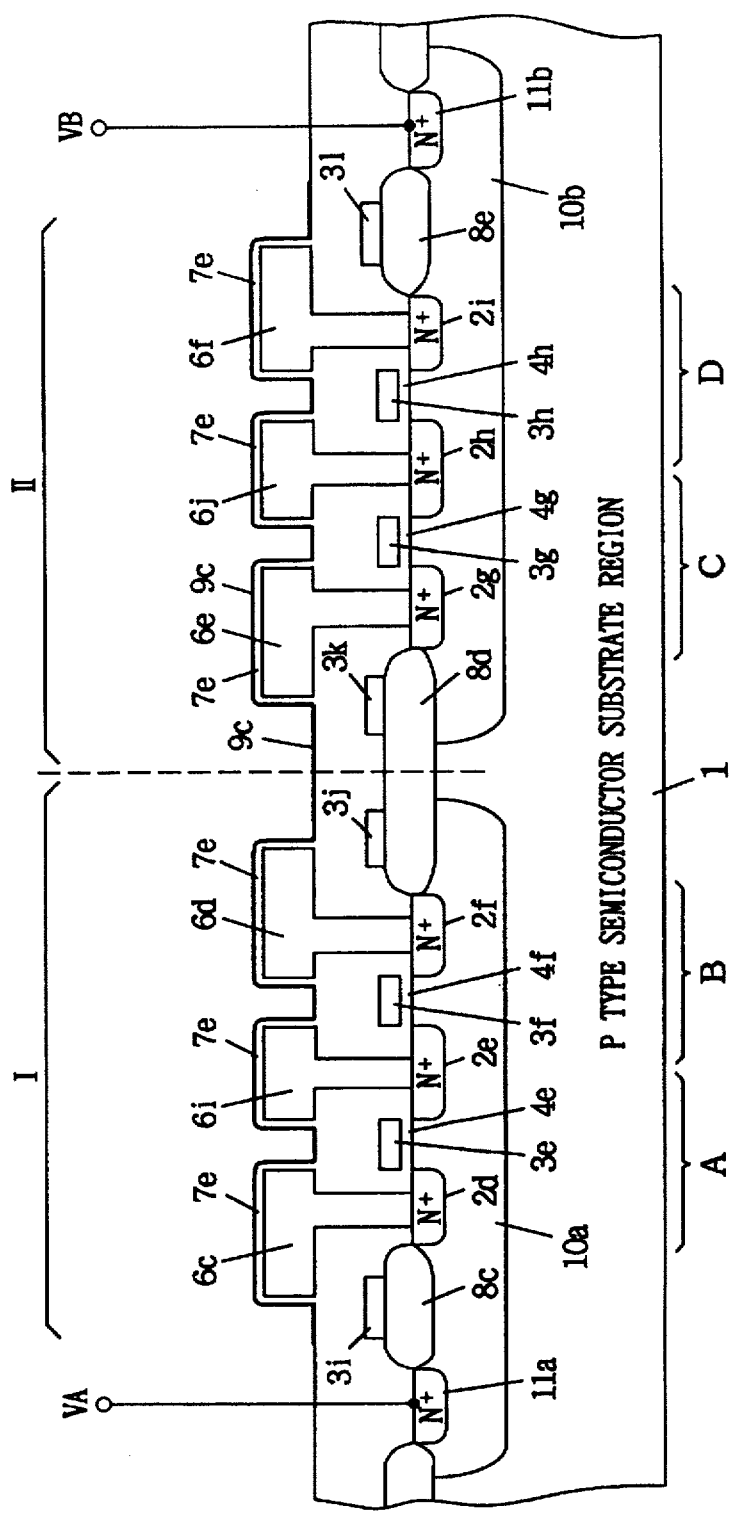
FIGS. 16–18 schematically show structures of semiconductor devices according to sixth through eighth embodiments of the present invention.

FIG. 16 schematically shows a structure of a semiconductor device according to a sixth embodiment of the present invention. The structure shown in FIG. 16 is different from that shown in FIG. 14 in the following points. The conductive layer corresponding to a bit line is not provided. For impurity regions 2e and 2h electrically connected to the conductive layer corresponding to a bit line, conductive layers 6i and 6j corresponding to storage nodes are provided. Conductive layers 6i and 6j are electrically connected to the corresponding impurity regions 2e and 2h, respectively. Conductive layer 9c corresponding to a cell plate is arranged to face the surface of conductive layers 6c, 6i, 6d, 6e, 6j and 6f with insulating film 7e interposed therebetween.

In the structure shown in FIG. 16, N wells 10a and 10b are completely isolated in a DC fashion (because the conductive line corresponding to a bit line is not provided). The capacitance values of regions I and II are increased by the newly provided conductive layers 6i and 6j, respectively. As a result, a capacitor with a great capacitance value which operates more stably can be realized. The rest of the structure is the same as that shown in FIG. 14, and the corresponding portions are labeled with the identical reference numerals.

As described above, according to the sixth embodiment, at the impurity regions connected to the conductive lines corresponding to the bit line in N wells isolated from each other the conductive layers corresponding to storage nodes are formed in place of the conductive layers corresponding to the bit line, and are electrically connected to these impurity regions and arranged to face the conductive layer corresponding to a cell plate with the insulating film interposed therebetween. Accordingly, the N wells are completely isolated in a DC fashion to realize desired dielectric breakdown voltage characteristics, and the newly provided conductive layer contributes to a greater capacitance value to realize a capacitor with excellent area efficiency.

Embodiment 7

Figure 17:
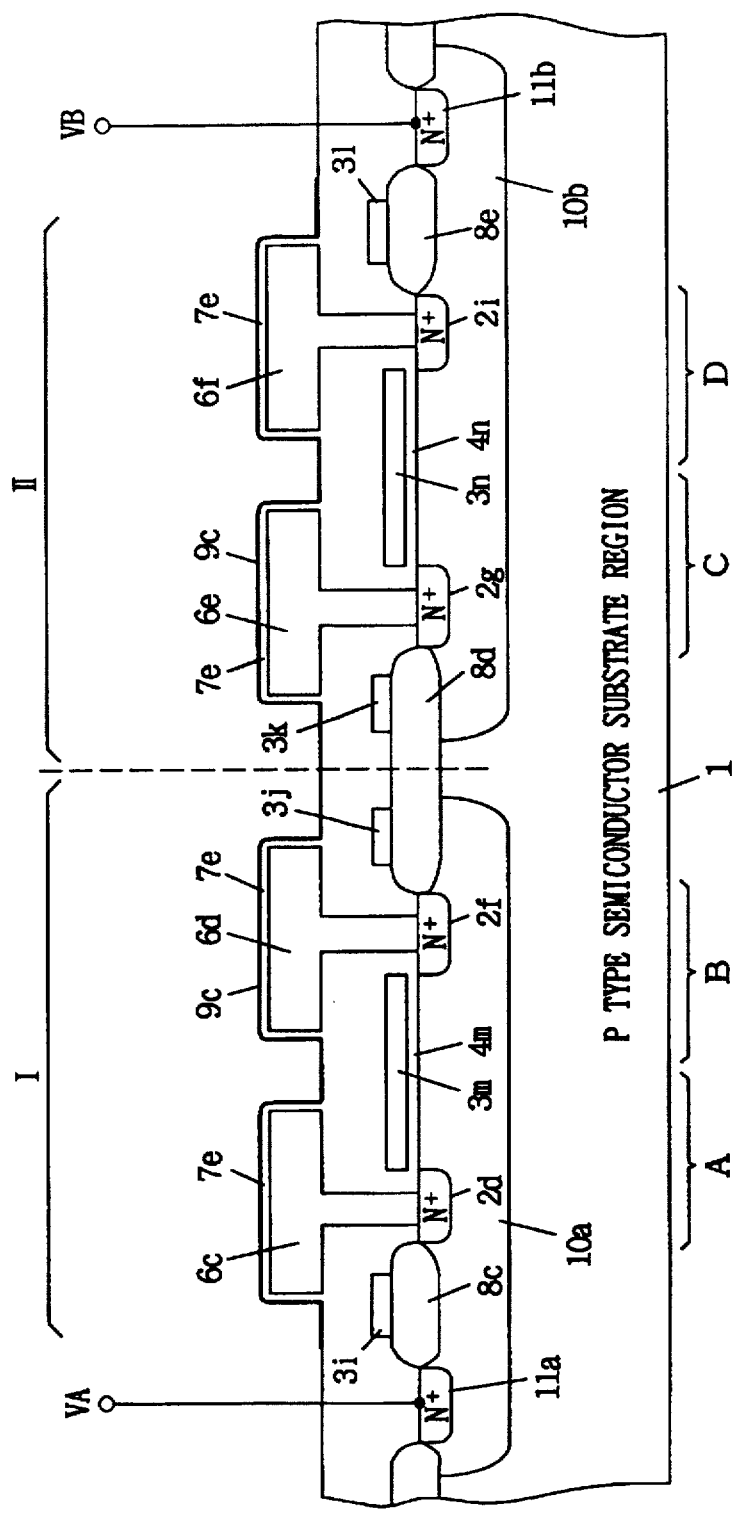

FIG. 17 schematically shows a structure of a semiconductor device according to a seventh embodiment of the present invention. The structure of the semiconductor device shown in FIG. 17 is different from that of the semiconductor device shown in FIG. 14 in the following points. The conductive layer corresponding to a bit line is not provided. The impurity region (region 2e, 2h in FIG. 14) connected to the conductive line (a fifth conductive layer) corresponding to a bit line is not provided. In N well 10a, gate electrode layer (conductive layer) 3m corresponding to a word line is provided between impurity regions 2d and 2f on the surface of N well 10a with gate insulating film 4m interposed therebetween. In N well 10b, gate electrode layer (conductive layer) 3n corresponding to a word line is disposed between impurity regions 2g and 2i on the surface of N well 10b with gate insulating film 4n interposed therebetween.

In the structure shown in FIG. 17 as well, N wells 10a and 10b are isolated from each other in a DC fashion and capacitance is divided as desired, so that dielectric breakdown voltage characteristics are ensured and the capacitor having a desired capacitance value can be connected between nodes VA and VB.

In addition, in the structure shown in FIG. 17, the area of the surface of conductive layers 3m and 3n is increased, leading to an increase in area facing N wells 10a and 10b, respectively. As a result, the capacitors formed by conductive layers 3m and 3n have a greater capacitance value, and therefore, the capacitor as a whole has a greater capacitance value.

As described above, according to the seventh embodiment of the present invention, the impurity region connected to the conductive layer corresponding to a bit line is eliminated and the gate electrode layer (conductive layer) corresponding to a word line is arranged to extend over that region between impurity regions, so that the capacitor between the conductive layer and the N well serving as a substrate region has a greater capacitance, so that the capacitor with excellent area efficiency can be realized.

Embodiment 8

Figure 18:
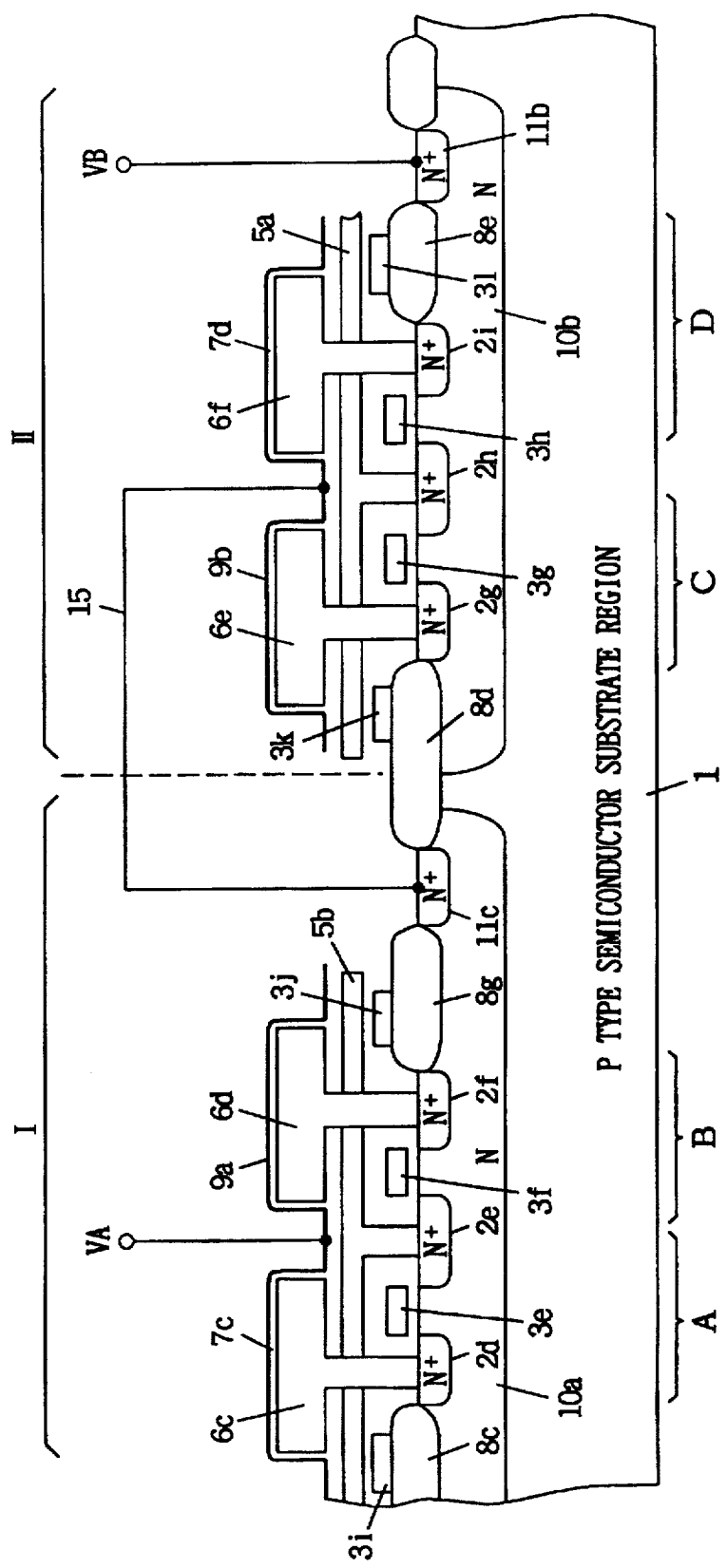

FIG. 18 schematically shows a structure of a semiconductor device according to an eighth embodiment of the present invention. Referring to FIG. 18, two N wells 10a and 10b are formed on P type semiconductor substrate region 1 to be isolated from each other. N well 10a corresponds to region I, while N well 10b corresponds to region II. Impurity regions 2d, 2e, and 2f are formed at the surface of N well 10a as in the memory cell structure. Conductive layers 6c and 6d corresponding to storage nodes are provided for impurity regions 2d and 2f. Conductive layer 5b corresponding to a bit line is arranged to be connected to impurity region 2e. Conductive layer 5b interconnects impurity regions 2e of the capacitance elements included in region I. Facing the surface of conductive layers 6c and 6d, conductive layer 9a corresponding to a cell plate is arranged with gate insulating film 7c interposed therebetween. Conductive layer 9a is electrically connected to electrode node VA. In addition, a high concentration N type impurity region 11c isolated from impurity region 2f by an element isolation film 8g is formed in N well 10a. Impurity region 11c is formed through the same manufacturing steps as impurity regions 2d–2f. Conductive layers 3i and 3j corresponding to word lines are arranged on element isolation films 8c and 8g.

Element isolation film 8d is formed at the boundary area between regions I and II to ensure electrical (DC fashion) isolation between N wells 10a and 10b. In N well 10b, impurity regions 2g, 2h and 2i are formed at the surface of N well 10b spaced apart from each other as in the memory cell structure. Conductive layers 6e and 6f corresponding to storage nodes are formed for impurity regions 2g and 2i. Conductive layer 5a corresponding to a bit line is formed at impurity region 2h. Conductive layer 5a is electrically isolated from conductive layer 5b in region I. Facing the surface of conductive layers 6e and 6f corresponding to storage nodes, conductive layer 9b corresponding to a cell plate is formed with insulating film 7d interposed therebetween. Conductive layer 9b is electrically connected to impurity regions 11c through an interconnection 15 with a low resistance.

In N well 10b, high concentration N type impurity region 11b is formed electrically isolated from impurity region 2i by element isolation film 8e. Impurity region 11b is electrically connected to electrode node VB. Conductive layers 3k and 3l corresponding to word lines are formed on element isolation films 8d and 8e, respectively. Conductive layers 9a and 9b are isolated from each other.

Figure 19:
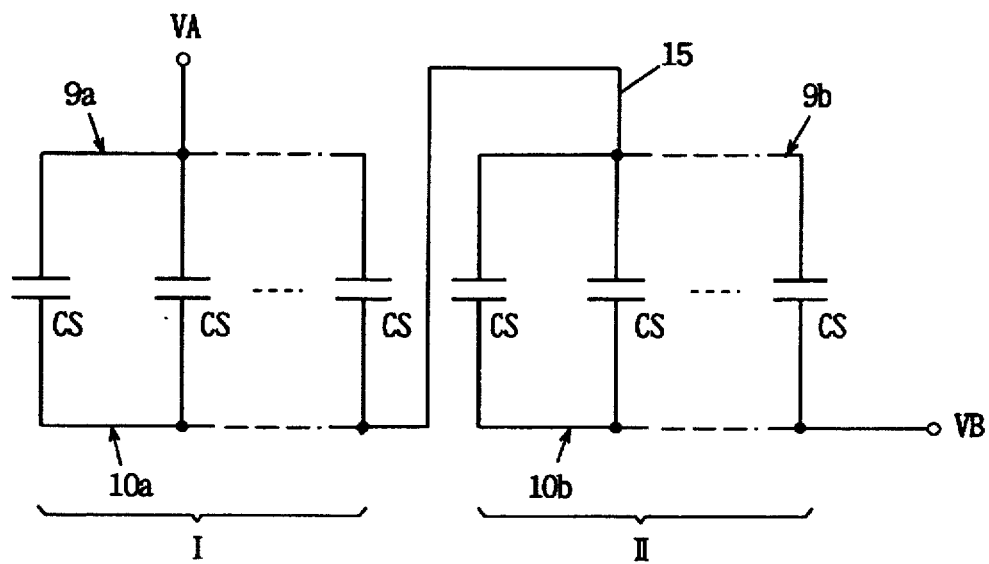
FIG. 19 shows an electrically equivalent circuit of the semiconductor device shown in FIG. 18.

FIG. 19 shows an electrically equivalent circuit of the capacitor shown in FIG. 18. Referring to FIG. 19, the capacitance elements included in region I are connected in parallel to each other between electrode node VA and N well 10a in the capacitor shown in FIG. 18. Meanwhile, the capacitance elements (CS) formed in region II are connected in parallel to each other between conductive layer 9b and electrode node VB. N well 10a and conductive layer 9b are interconnected by interconnection 15. Therefore, as apparent from the equivalent circuit diagram of FIG. 19, the set of capacitance elements connected in parallel and formed in region I and the set thereof in region II are serially connected between nodes VA and VB also in the semiconductor device shown in FIG. 18. The effects similar to those in the first through seventh embodiments described above can be obtained also in the present embodiment.

Embodiment 9

Figure 20:
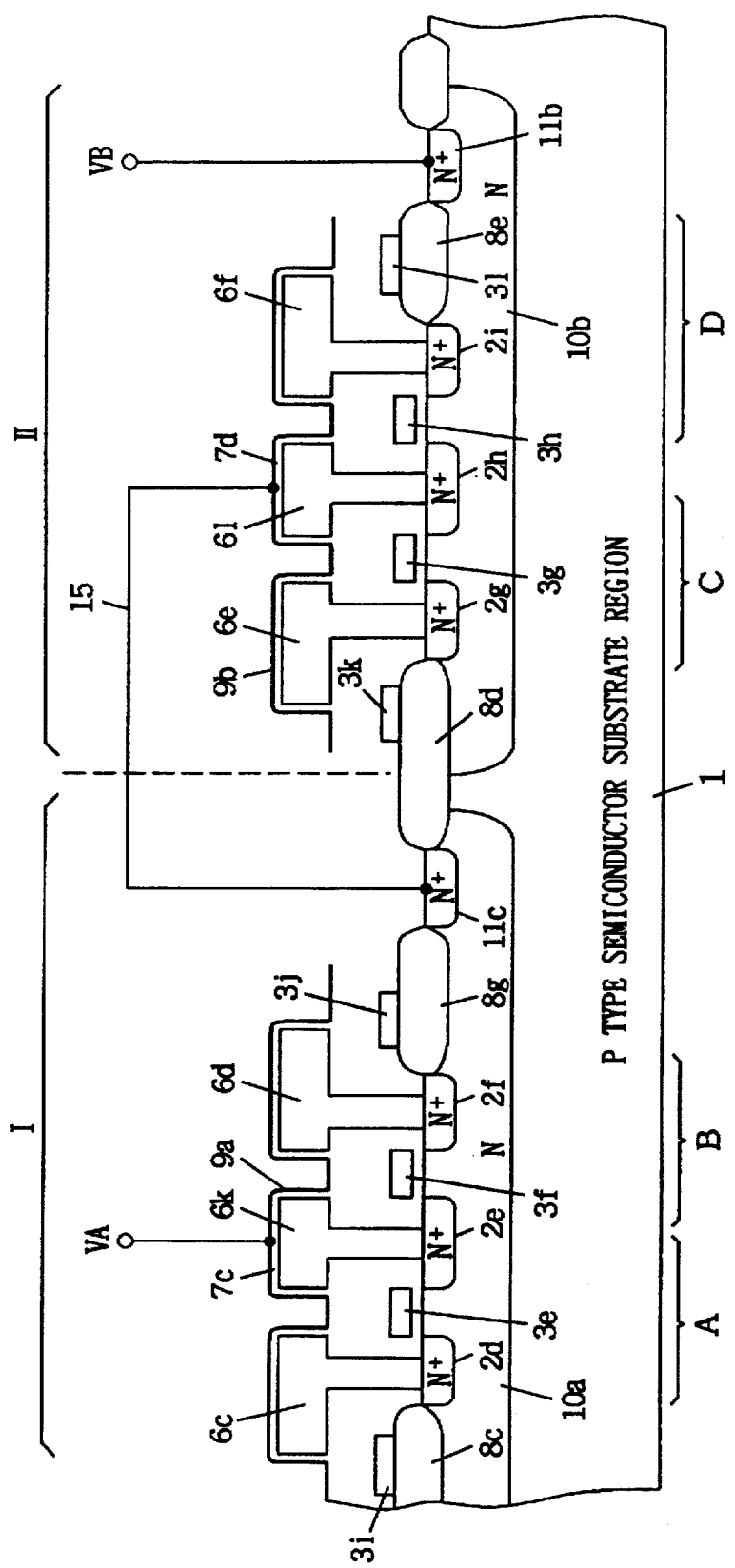
FIGS. 20 and 21 schematically show structures of semiconductor devices according to ninth and tenth embodiments of the present invention, respectively.

FIG. 20 shows a structure of a semiconductor device according to a ninth embodiment of the present invention. The semiconductor device shown in FIG. 20 has a structure different from the semiconductor device shown in FIG. 18 in the following points. For impurity regions 2e and 2h to be connected to the conductive layers corresponding to the bit line, conductive layers corresponding to storage nodes are provided. In region I, conductive layer 9a corresponding to a cell plate is arranged to face the surface of conductive layers 6c, 6k and 6d with insulating film 7c interposed therebetween. In region II, conductive layer 9b is arranged to face the surface of conductive layers 6a, 6l and 6f with insulating film 7a interposed therebetween.

As compared to the structure shown in FIG. 18, the area of the surface where conductive layer 9a faces the surface of conductive layers 6c, 6k and 6d is increased in the structure shown in FIG. 20. Similarly, the area of the surface where conductive layer 9b faces conductive layers 6e, 6l and 6f is increased. As a result, the capacitance values of the capacitors are increased in regions I and II.

According to the semiconductor device of the ninth embodiment, a capacitor with an even higher area efficiency can be achieved as well as the effects of the semiconductor device shown in FIG. 18.

Embodiment 10

Figure 21:
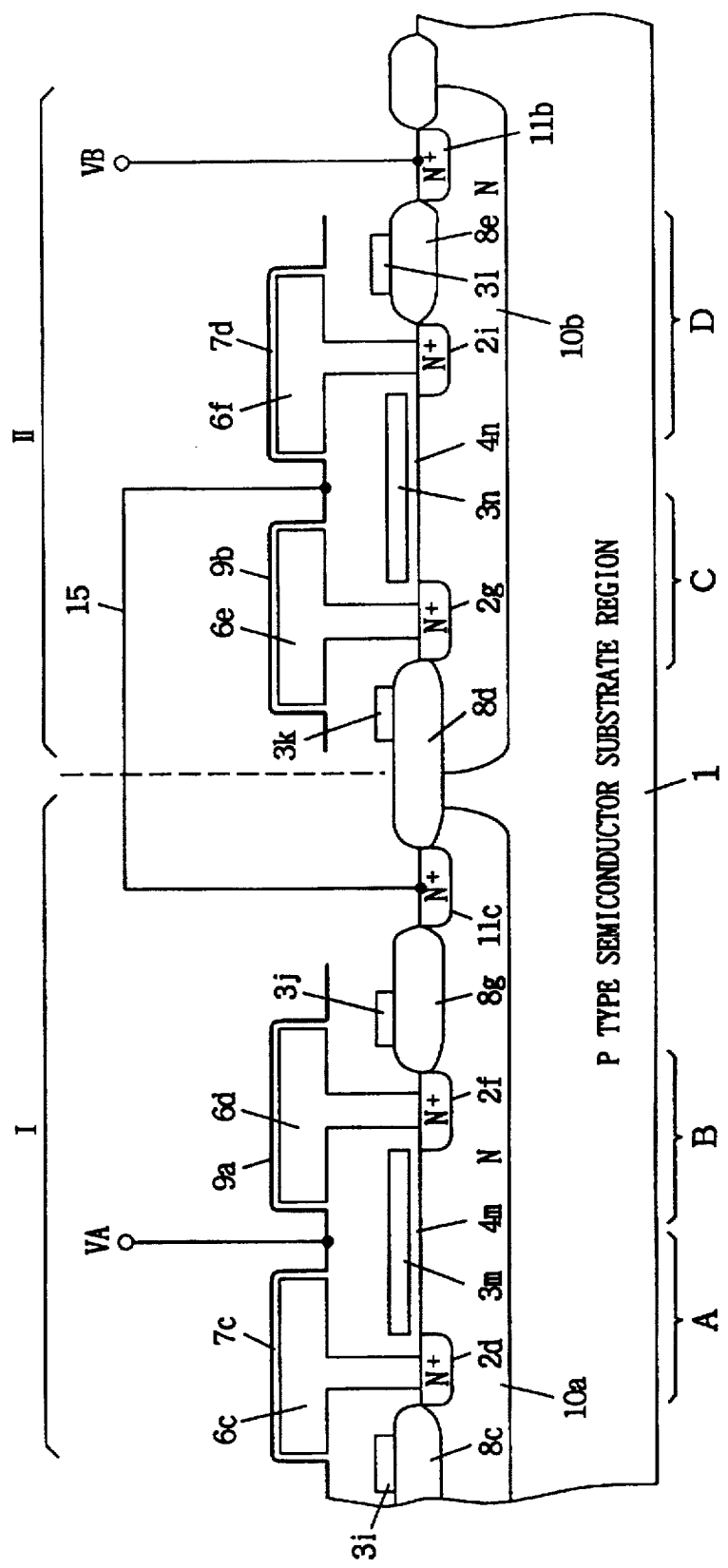

FIG. 21 schematically shows a structure of a semiconductor device according to a tenth embodiment of the present invention. The semiconductor device shown in FIG. 21 has a structure different from the semiconductor device shown in FIG. 18 in the following points. Conductive layers 5a and 5b corresponding to the bit line are not provided. Impurity regions 2e and 2h connected to conductive layers 5a and 5b corresponding to the bit line are not provided. In region I, conductive layer 3m is arranged between impurity regions 2d and 2f on the surface of N well 10a with gate insulating film 4m interposed therebetween. In region II, conductive layer 3n is arranged between impurity regions 2g and 2i on N well 10b with gate insulating film 4n interposed therebetween.

In the structure shown in FIG. 21, the capacitance value of the capacitor formed by electrode layer 3m and N well 10a is increased. Similarly, the capacitance value of the capacitor formed by conductive layer 3n and N well 10b is increased (because of an increase in area where the conductive layer faces the N well). As a result, the capacitance values of the capacitors can be increased in regions I and II.

As described above, according to the tenth embodiment, the capacitance value can be increased without an increase in area, thereby achieving a capacitor with excellent area efficiency.

Embodiment 11

Figure 22:
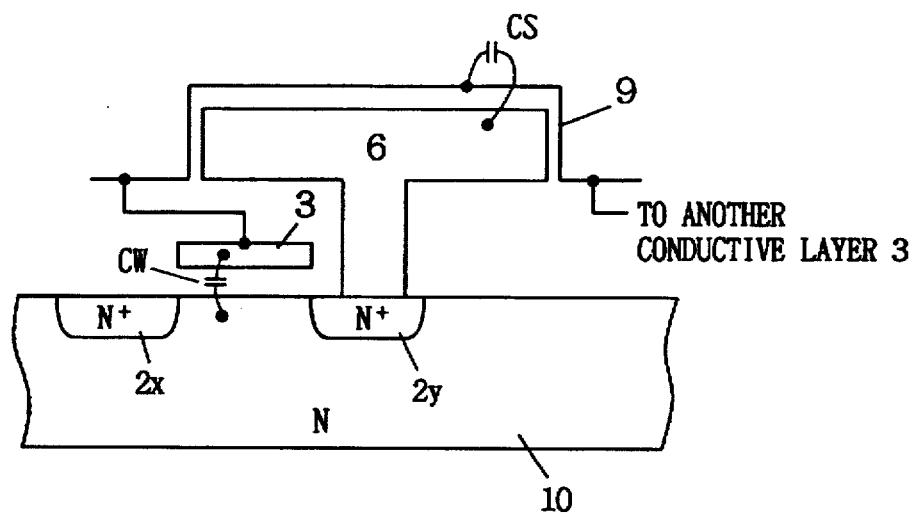
FIG. 22 schematically shows a structure of one capacitance element of a semiconductor device according to an eleventh embodiment of the present invention.

FIG. 22 shows a structure of a main part of a semiconductor device according to an eleventh embodiment of the present invention. A typical structure of one capacitance element is shown in FIG. 22. Referring to FIG. 22, high concentration N type impurity regions 2x and 2y are formed at the surface of N well 10. Conductive layer 6 corresponding to a storage node is electrically connected to impurity region 2y. Conductive layer 9 corresponding to a cell plate layer is arranged to face the surface of conductive layer 6 with an insulating film interposed therebetween.

Conductive layer 3 is formed between impurity regions 2x and 2y on the surface of N well 10 with a gate insulating film interposed therebetween. Conductive layer 3 is electrically connected to conductive layer 9. All the conductive layers 3 corresponding to word lines are electrically connected to conductive layer 9 corresponding to a cell plate line in the corresponding region. Thus, conductive layer 3 forms a capacitor with N well 10, so that capacitor CS formed by conductive layers 9 and 6 and the insulating film therebetween and capacitor CW formed by conductive layer 3, N well 10, and the gate insulating film therebetween are connected in parallel to each other. As a result, the capacitance value of the capacitor can be increased further.

1. Connection Manner 1

Figure 23:
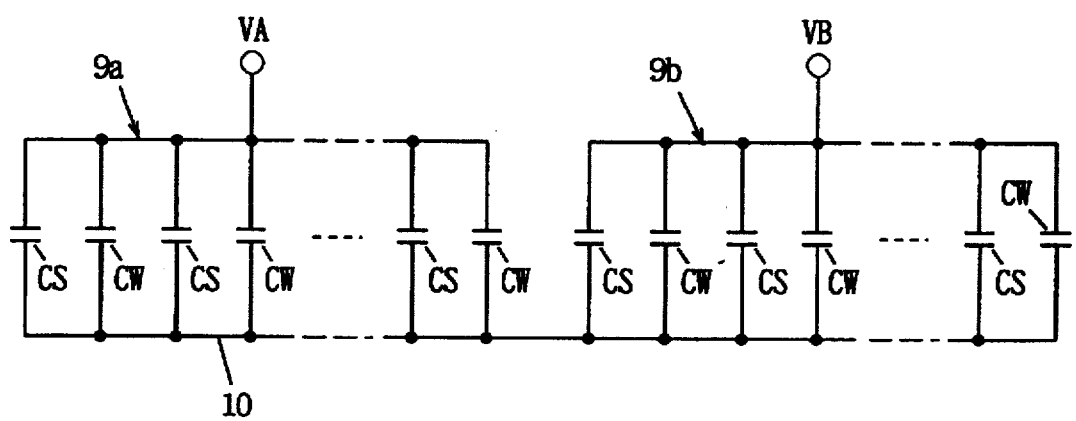
FIG. 23 shows an electrically equivalent circuit of the semiconductor device according to the eleventh embodiment of the present invention.

FIG. 23 is a diagram showing a first connection manner according to the eleventh embodiment of the present invention. The manner of connecting capacitance elements shown in FIG. 23 corresponds to the structure of the capacitor shown in FIG. 5. Conductive layers 9a and 9b corresponding to the cell plate are arranged isolated from each other. Node VA is electrically connected to conductive layer 9a, while node VB is electrically connected to conductive layer 9b. Capacitors CS are connected in parallel to each other between conductive layer 9a and N well 10. In parallel to capacitors CS, capacitors CW each formed by conductive layer 3 corresponding to the gate electrode layer (word line) are connected in parallel to each other. Similarly, capacitors CS and CW are connected in parallel between conductive layer 9b and N well 10. Capacitor CW does not simply contribute as parasitic capacitance but is surely connected as a capacitor in parallel to capacitor CS, ensuring increase in capacitance value of the capacitor.

2. Connection Manner 2

FIG. 24A is a diagram showing a second manner of connection according to the eleventh embodiment of the present invention. The connection manner shown in FIG. 24A corresponds the structure of the semiconductor device shown in FIG. 14. In this structure, conductive layer 9c corresponding to a cell plate is connected in common to all the capacitance elements. N wells 10a and 10b are isolated from each other. N well 10a is electrically connected to node VA, and N well 10b is electrically connected to node VB. In this manner of connection as well, conductive layer 3 corresponding to the gate electrode layer and conductive layer 9c corresponding to a cell plate are interconnected, so that capacitors CW and CS are connected in parallel to each other between N well 10a and conductive layer 9c and between conductive layer 9c and N well 10b.

3. Connection Manner 3

FIG. 24B is a diagram showing a third connection manner according to the eleventh embodiment of the present invention. In the manner of connection shown in FIG. 24, conductive layers 9a and 9b corresponding to the cell plate are isolated from each other, and N wells 10a and 10b are also isolated from each other. Node VA is electrically connected to conductive layer 9a, and N well 10b is electrically connected to node VB. N well 10a is connected to conductive layer 9b through interconnection 15. In this connection manner as well, conductive layer 3 corresponding to the word line (gate electrode layer) and the conductive layer corresponding to a cell plate are interconnected, whereby capacitors CS and CW are connected in parallel to each other between conductive layer 9a and N well 10a and between conductive layer 9b and N well 10b.

As described above, according to the eleventh embodiment, the conductive layer corresponding to a word line and the conductive layer corresponding to a cell plate are electrically interconnected, so that the capacitor which corresponds to a memory cell capacitor and is located between the conductive layer corresponding to a cell plate and the N well serving as a substrate region and the capacitor located between the conductive layer corresponding to a gate electrode layer and the N well are connected in parallel to each other, thereby realizing a capacitor with a greater capacitance value.

Embodiment 12

Figure 25A:
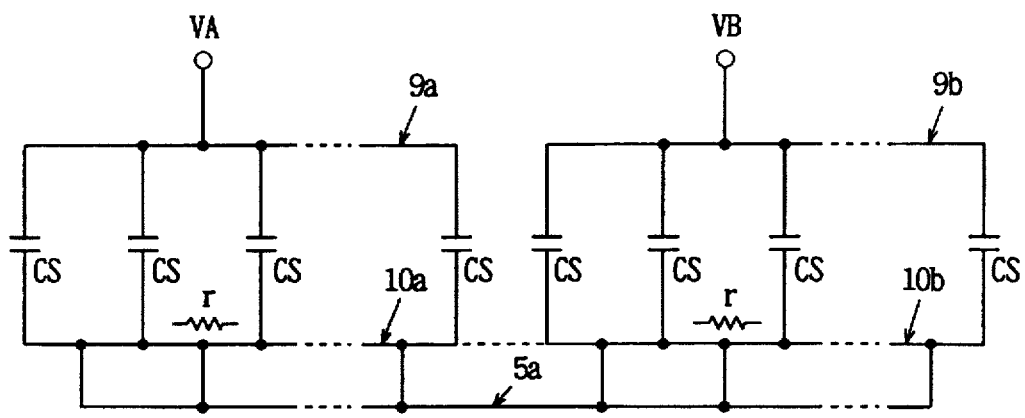
FIGS. 25A to 25C show electrically equivalent circuits of semiconductor devices according to a twelfth embodiment of the present invention.
Figure 25B:
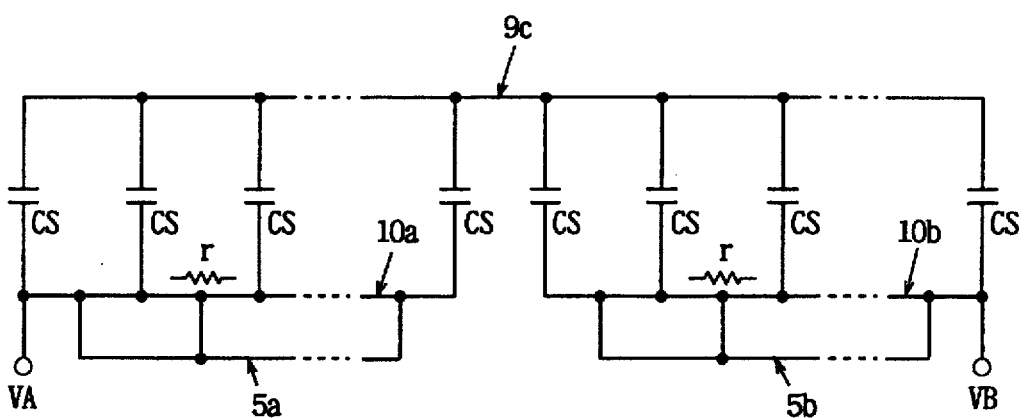
Figure 25C:
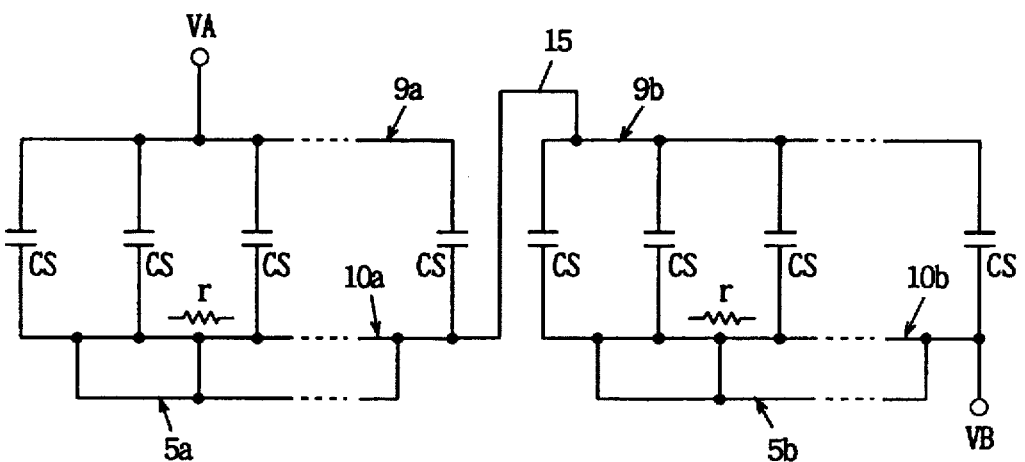

FIGS. 25A–25C show electrically equivalent circuits of semiconductor devices according to a twelfth embodiment of the present invention. Referring to FIG. 25A, N wells 10a and 10b isolated from each other are interconnected by conductive layer 5a corresponding to a bit line. Conductive layer 5a corresponding to a bit line is connected to N wells 10a and 10b through the impurity regions as described above with reference to FIG. 5. The bit line is formed of a low resistance conductor (for reduction in loss of the signal amplitude and for fast signal propagation). Therefore, N wells 10a and 10b are connected with low resistance by employing conductive layer 5a having the same structure as the bit line with low resistance. As a result, diffusion resistance r of N wells 10a and 10b effectively attains a negligible value, thereby reducing parasitic resistance of the capacitor connected between nodes VA and VB, and therefore electric charges can be supplied or absorbed quickly following the change in voltage at nodes VA and VB. Consequently, a decoupling capacitor with quick response and excellent frequency characteristics can be implemented. In FIG. 25A, conductive layers 9a and 9b are isolated from each other and connected to nodes VA and VB. The N wells can be isolated from each other or can be formed as one common well.

In the structure shown in FIG. 25B, nodes VA and VB are electrically connected to N wells 10a and 10b, respectively. Capacitors CS have respective one-side electrodes connected in common by conductive layer 9c. N well 10a is interconnected by conductive layer 5a corresponding to a bit line through the impurity region (not explicitly shown). N well 10b is also connected by conductive layer 5b corresponding to a bit line through the impurity region (not explicitly shown). Parasitic resistance accompanying nodes VA and VB can be reduced (the diffusion resistors of N wells 10a and 10b attain a substantially negligible resistance r due to the "shunt" structure formed by conductive layers 5a and 5b, respectively), and electric charges can be absorbed or supplied from capacitor CS quickly in response to the change in nodes VA and VB.

In the structure shown in FIG. 25C, conductive layer 9a corresponding to a cell plate is connected to node VA, and N well 10a is electrically connected to conductive layer 9b through interconnection 15. N well 10b is electrically connected to node VB. N well 10a and conductive layer 5a corresponding to a bit line are connected in parallel through the impurity region which is not shown. Conductive layer 5b corresponding to a bit line is electrically connected to N well 10b through the impurity region which is not shown. In this structure as well, diffusion resistance r of N wells 10a and 10b can be decreased to a substantially negligible value by conductive layers 5a and 5b, so that RC delay accompanying movement of electric charges can be considerably reduced, and a capacitor which is excellent in quick response and has improved frequency characteristics can be realized.

As described above, according to the twelfth embodiment of the present invention, N wells are connected by the conductive line corresponding to the bit line through the impurity regions at prescribed distances, the diffusion resistance of N well and accordingly RC delay in propagating charges can be neglected substantially, thereby realizing a capacitor which is capable of responding at a high speed and has excellent frequency characteristics.

Embodiment 13

Figure 26:
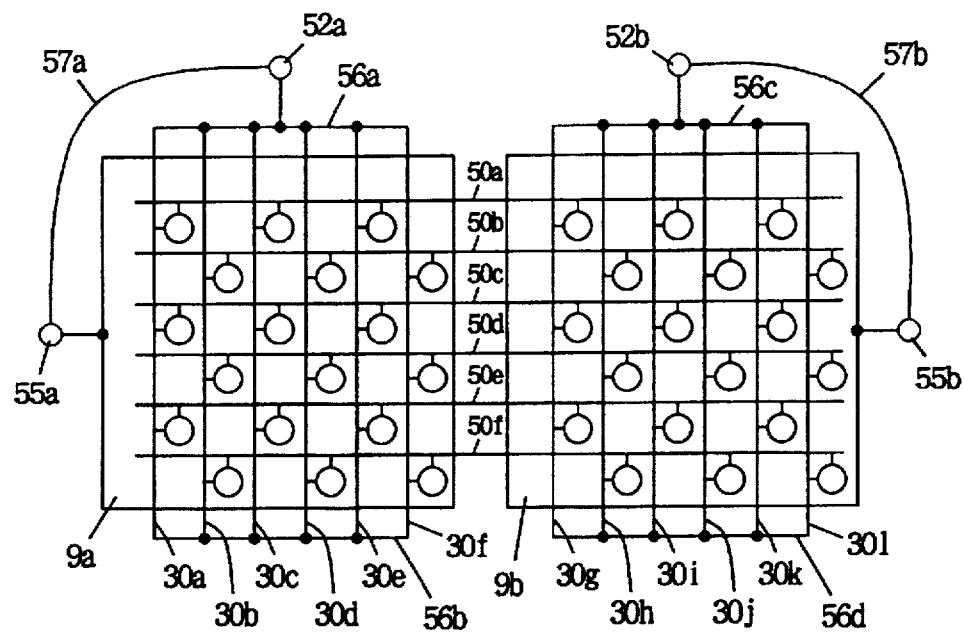
FIGS. 26 and 27 schematically show structures of semiconductor devices according to thirteenth and fourteenth embodiments of the present invention.

FIG. 26 is a diagram schematically showing a structure of a semiconductor device according to a thirteenth embodiment of the present invention. Referring to FIG. 26, a plurality of capacitance elements (indicated by O in the figure) are arranged in a matrix of rows and columns. The capacitance element has a structure similar to a DRAM memory cell. Conductive layers 30a–30n like word lines are disposed corresponding to respective rows of the capacitance elements. Conductive lines 50a–50f like bit lines are disposed in the column direction. Since the capacitance elements are arranged similarly to memory cells, the conductive layers like bit lines are disposed in pairs. The capacitance elements are arranged corresponding to crossings between the conductive layers forming a pair (such as conductive layers 50a and 50b) and each of conductive lines 30a–30l corresponding to word lines. Conductive layers 30a–30f corresponding to word lines are interconnected at the opposite ends by interconnections 56a and 56b formed of low resistance material, such as, aluminum. Interconnection 56a is electrically connected to a common node 52a. Conductive layers 30g–30l corresponding word lines are interconnected at the opposite ends by interconnections 56c and 56d formed of aluminum with low resistance. Interconnection 56c is electrically connected to a common node 52b.

Conducive layer 9a like a cell plate is disposed corresponding to conducive layers 30a–30f corresponding to word lines. Conductive layer 9b like a cell plate is disposed corresponding to conductive layers 30g–30l. Conductive layers 9a and 9b are isolated from each other. Conductive layer 9a is electrically connected to a node 55a. Nodes 52a and 55a are interconnected by a low resistance interconnection 57a. Conductive layer 9b is interconnected to node 55b, which is electrically connected to common node 52b through an interconnection 57b with low resistance.

The arrangement shown in FIG. 26 is electrically equivalent to the circuit shown in FIG. 25A. By arranging the capacitance elements in a matrix of rows and columns, a great number of capacitance elements are efficiently arranged with a small occupying area to realize a capacitor with excellent area efficiency. Thus, conductive layers 30a–30l corresponding to word lines are electrically connected to the corresponding conductive layers 9a and 9b like the cell plate, so that capacitors formed by conductive layers 30a–30l and the substrate region (N well) are additionally provided in parallel, thereby increasing the capacitance value. The electrode node of the capacitor is positioned appropriately depending on which equivalent circuit of FIGS. 25A–C is realized.

When the equivalent circuits in FIG. 25B and C are implemented, conductive layers 50a–50f corresponding to bit lines are divided corresponding to conductive layers 9a and 9b and isolated from each other.

As described above, according to the thirteenth embodiment of the present invention, the capacitance elements are arranged in a matrix, the conductive layers corresponding to word lines are electrically interconnected, and the interconnection node of the conductive layers corresponding to word lines is electrically connected to the corresponding conductive layer like the cell plate, so that conductive layers corresponding to word lines can be utilized as capacitance elements and a capacitor with excellent area efficiency can be implemented. In addition, a plurality of capacitance elements can be arranged efficiently by arranging the capacitance elements in a matrix of rows and columns.

Embodiment 14

Figure 27:
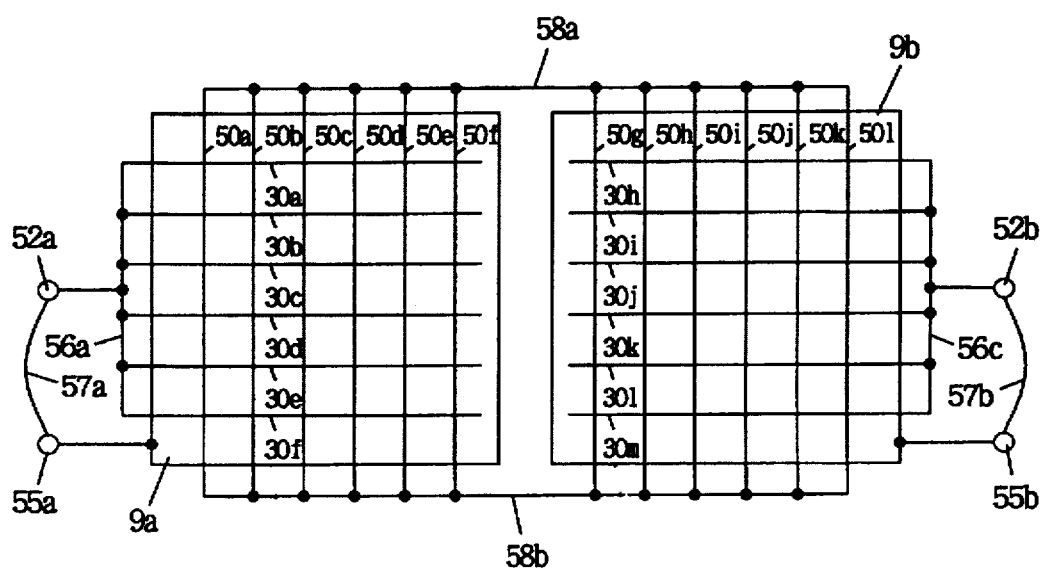

FIG. 27 is a diagram schematically showing a structure of a semiconductor device according to a fourteenth embodiment of the present invention. Referring to FIG. 27, conductive layers 30a–30g serving as word lines are arranged corresponding to conductive layer 9a corresponding to cell plate, and conductive layers 30h–30n like word lines are arranged corresponding to conductive layer 9b like the cell plate. Conductive layers 30a–30g are interconnected by low resistance interconnection 50a formed of, for example, aluminum. Interconnection 56a is electrically connected to a common node 52a. Conductive layers 30h–30n are interconnected by low resistance interconnection 56c. Interconnection 56c is electrically connected to a common node 52b. Conductive layers 9a and 9b are isolated from each other. Conductive layers 50a–50f corresponding to bit lines are arranged in a direction perpendicular to conductive layers 30a–30g. Conductive layers 50g–50l corresponding to bit lines are arranged in a direction perpendicular to conductive layers 30h–30n. Conductive layers 50a–50l are interconnected at the opposite ends by low resistance interconnections 58a and 58b. Conductive layer 9a is connected to node 55a, which in turn is connected to common node 52a through low resistance interconnection 57a. Conductive layer 9b is electrically connected to node 55b, which in turn is electrically connected to common node 52b through low resistance interconnection 57b.

Each group of conductive layers 50a–50f and 50e–50l extends only in one well region. Even if noise is generated at one of conductive layers 50a–50l, the noise is dispersed and therefore the entire noise is absorbed, so that the electrode structure highly immune to noise can be implemented. The arrangement shown in FIG. 27 corresponds to the connection manner shown in FIG. 25A (capacitor CW formed by the conductive layer corresponding to a word line is not shown in FIG. 25A). If the conductive layer corresponding to a bit line is also divided, interconnections 58a and 58b are divided in accordance with the manner of dividing conductive layers 9a and 9b. The arrangement of the capacitance elements is the same as that shown in FIG. 26.

As described above, according to the fourteenth embodiment, the capacitance elements are arranged in a matrix of rows and columns and the conductive layers corresponding to word lines are electrically connected in common to the corresponding conductive layer like a cell plate, whereby the conductive layer serving as a word line can be utilized as a capacitor and a great capacitance value can be achieved with a small occupying area.

Embodiment 15

Figure 28A:
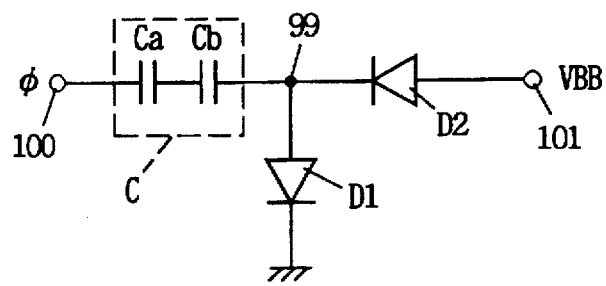
FIG. 28A shows a structure of a semiconductor device according to a fifteenth embodiment of the present invention and FIG. 28B is an operation waveform diagram thereof.
Figure 28B:
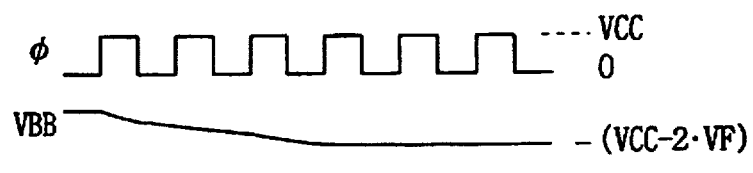

FIG. 28A shows a structure of a semiconductor device according to a fifteenth embodiment of the present invention, and FIG. 28B is a waveform diagram representing operation of the semiconductor device shown in FIG. 28A. Referring to FIG. 28A, the semiconductor device includes a capacitor C connected between an input node 100 and an internal node 99, a diode D1 connected between internal node 99 and a ground node, and a diode D2 connected between internal node 99 and an output node 101. As capacitor C, the capacitor described in connection with the first through fourteenth embodiments above is employed. More specifically, a plurality of capacitors Ca and Cb having the same structure as a memory cell capacitor are connected in series. Each of capacitors Ca and Cb can be formed by a plurality of capacitance elements or by one capacitance element. Diode D1 has an anode connected to internal node 99 and a cathode connected to the ground node. Diode D2 has a cathode connected to internal node 99 and an anode connected to an output node 101. Operation of the semiconductor device will be described hereinafter with reference to the operation waveform shown in FIG. 28B.

A clock signal φ from a signal source which is not shown changes between ground potential VSS (0 V) and power supply voltage VCC with a predetermined pulse width and period. When clock signal φ rises to a high level, the potential of internal node 99 rises by the charge pumping operation of capacitor C. The potential of internal node 99 exceeds that of output node 101, and diode D2 enters a reverse bias state and therefore attains an off state. Diode D1 is rendered conductive, thereby reducing the potential of internal node 99 to voltage level of VF, where VF indicates the forward voltage drop of diodes D1 and D2.

When clock signal φ falls to a low level (0 V), the potential VF of internal node 99 is lowered to the voltage level of VF−VCC by the charge pumping operation of capacitor C. In this state, diode D2 is rendered conductive and positive charges flow from output node 101 to internal node 99, whereby voltage VBB of output node 101 is decreased. When the difference in potential between output node 101 and internal node 99 reaches VF, diode D2 is turned off. Clock signal φ rises again to a high level, and the potential of internal node 99 rises and clamped to voltage level of VF by diode D1. By repeating the operation above, voltage VBB from output node 101 is reduced to the voltage level of −VCC+2·VF.

This voltage level is negative. Negative voltage VBB is applied to the substrate region of the memory array portion in a DRAM and used as a bias voltage. A structure in which negative voltage VBB is transmitted to nonselected word lines may be used to prevent misselection of a word line. Such a circuit is provided on-chip in a DRAM. Therefore, it is desirable to achieve as small occupying area as possible. The amount of electric charges injected by capacitor C (charge pumping ratio) is in proportion to the capacitance value thereof. Thus, by utilizing capacitor C having a great capacitance value with small occupying area described in the first through fourteenth embodiments above, a negative voltage generation circuit for efficiently producing negative voltage VBB at a desired voltage level can be implemented with a small occupying area.

Embodiment 16

Figure 29A:
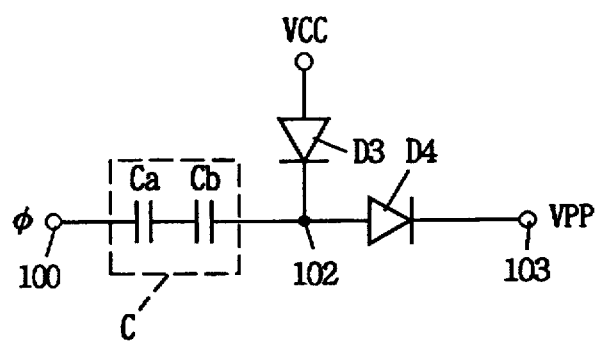
FIG. 29A shows a structure of a semiconductor device according to a sixteenth embodiment of the present invention and FIG. 29B is an operation waveform diagram thereof.
Figure 29B:
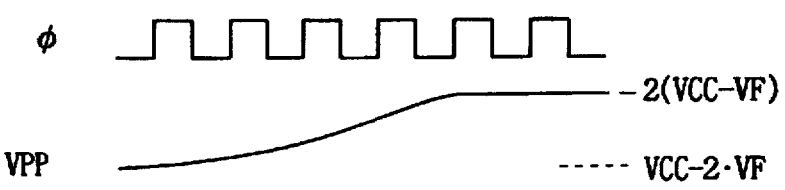

FIG. 29A shows a structure of a semiconductor device according to a sixteenth embodiment of the present invention, and FIG. 29B shows operation waveform of the semiconductor device shown in FIG. 29A. Referring to FIG. 29A, capacitor C is connected between output node 100 and an internal node 102, a diode D3 is connected between power supply node VCC and internal node 102, and a diode D4 is connected between internal node 102 and an output node 103. Diode D3 has an anode connected to power supply node VCC and a cathode connected to internal node 102. Diode D4 has an anode connected to internal node 102 and a cathode connected to output node 103. As capacitor C, the capacitor described in any of the first to fourteenth embodiments above is employed. Two capacitors Ca and Cb connected in series are shown representatively. Next, operation of the semiconductor device shown in FIG. 29A will be described with reference to FIG. 29B showing operation waveform thereof.

When clock signal φ is at a low level, the potential of internal node 102 also falls to a low level. At this time, diode D3 is rendered conductive and internal node 102 is clamped to the voltage level of VCC−VF by diode D3, where VF shows the forward voltage drop of diodes D3 and D4. In this state, the voltage level of internal node 102 is lower than the voltage level of VPP of output node 103, and therefore diode D4 is in an off state. When clock signal φ rises to a high level, the voltage level of internal node 102 rises to the voltage level of 2·VCC−VF, thereby rendering diode D4 conductive. As a result, positive charges flow from internal node 102 to output node 103 and the voltage level of voltage VPP is increased. When the voltage level of internal node 102 reaches VPP+VF, diode D4 is turned off. When clock signal φ attains a low level again, the potential level of node 102 is lowered by charge pumping operation of capacitor C and precharged to the voltage level of VCC−VF by diode D3. When the voltage level of clock signal φ rises again, the voltage level of internal node 102 is raised by charge pumping operation of capacitor C. Through repetition of the operation above, voltage VPP from the output node increases to the voltage level of 2·VCC−2·VF.

Voltage VPP is higher than power supply voltage VCC and used for forming a word line driving signal transmitted on the selected word line in a DRAM. The voltage is also used for producing a connection control signal for connecting a bit line pair in a selected block to a sense amplifier in other arrangement such as a shared sense amplifier arrangement. Such circuit for generating high voltage VPP is provided on-chip. Therefore, a high voltage generation circuit with a small occupying area is required. The high voltage generation circuit utilizes the charge pumping operation of capacitor C. The amount of electric charges introduced in one cycle of the clock signal is in proportion to the capacitance value of capacitor C. Thus, by employing any of the capacitors described in the first to fourteenth embodiments above, electric charges can be introduced efficiently and a high voltage generation circuit with a small occupying area which is capable of producing stable high voltage VPP at a high speed can be realized.

Embodiment 17

Figure 30A:
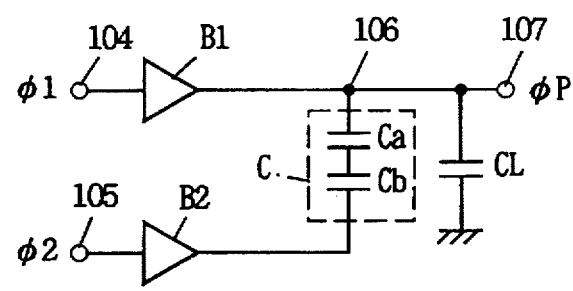
FIG. 30A shows a structure of a semiconductor device according to a seventeenth embodiment of the present invention and FIG. 30B is an operation waveform diagram thereof.
Figure 30B:
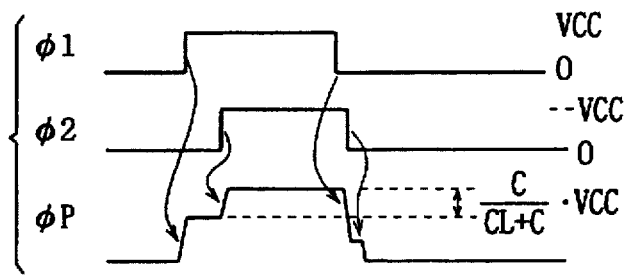

FIG. 30A shows a structure of a semiconductor device according to a seventeenth embodiment of the present invention, and FIG. 30B is a signal waveform diagram showing operation of the semiconductor device shown in FIG. 30A. Referring to FIG. 30A, the semiconductor device includes a buffer B1 for buffering a control signal (clock signal φ1) applied to a signal input node 104 and transmitting the signal to an internal node 106, a buffer B2 for buffering a control signal φ2 (clock signal) applied to a signal input node 105 and transmitting the signal through capacitor C to internal node 106, and a load capacitance CL connected between output node 107 and the ground node. Capacitor C has the structure of the capacitor described in any of the first through fourteenth embodiments above. Now, operation will be described with reference to the signal waveform diagram of FIG. 30B.

When control signal φ1 applied to signal input node 104 rises to a high level of power supply voltage VCC level, the potential of node 106 is raised by buffer B1 and capacitance CL is charged to power supply voltage VCC level. Control signal φ2 is still at a low level at this moment of time. Subsequently, when clock signal φ2 rises to a high level, a signal at power supply voltage VCC level is applied from buffer B2 to capacitor C. Capacitor C performs charge pumping operation in accordance with the signal of a high level from buffer B2 to raise the potential of node 106. The electric charges supplied from capacitor C is provided to load capacitance CL. As a result, the voltage level of signal φp of output node 107 is further increased to exceed power supply voltage VCC level. The voltage level is obtained by the following equation. The electric charges of C·V are injected to node 106 by capacitor C. The capacitance of node 106 (output node 107) is equal to (C+CL). Therefore, increase ΔV in potential of node 106 (that is 107) due to the injected charges C·V can be obtained as follows from the charge conservation law:

$$C \cdot V = \Delta V \cdot (CL+C)$$

Therefore $$\Delta V = C \cdot VCC/(CL+C)$$

When control signals φ1 and φ2 fall to a low level, the potential of output node 107 falls to a low level of the ground potential level. Signal φp applied from output node 107 is used as, for example, a boosted word line signal (for further increasing the word line potential when the voltage level of the selected word line attains a high level). The greater the capacitance value of capacitor C is, the higher becomes the boosted voltage level. In such circuit for producing control signal φp as well, a voltage boosting circuit for producing control signal φp at a desired voltage level can be realized with a small occupying area by employing capacitor C of the first through fourteenth embodiments as capacitor C.

Embodiment 18

Figure 31A:
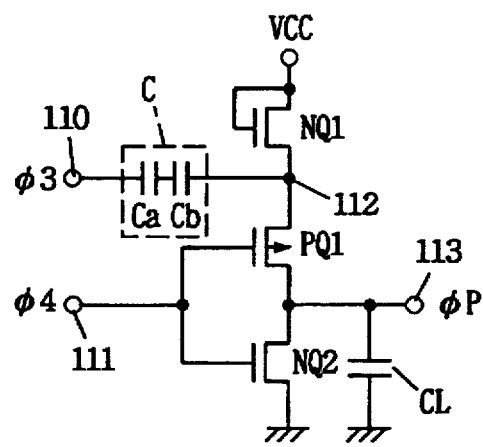
FIG. 31A shows a structure of a semiconductor device according to an eighteenth embodiment of the present invention and FIG. 31B is a signal waveform diagram representing the operation thereof.
Figure 31B:
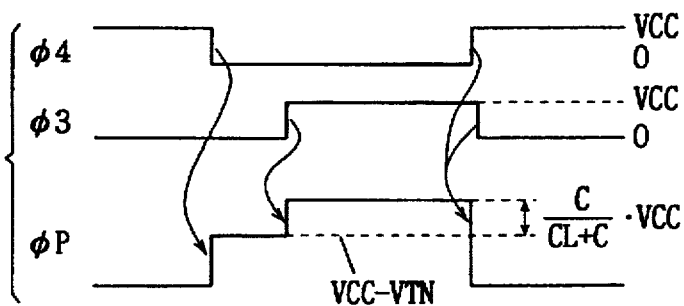

FIG. 31A shows a structure of a semiconductor device according to an eighteenth embodiment of the present invention, and FIG. 31B is a signal waveform diagram representing operation of the semiconductor device of FIG. 31A. Referring to FIG. 31A, the semiconductor device includes: capacitor C connected between an input node 110 receiving a control signal φ3 and an internal node 112; a diode-connected n channel MOS transistor NQ1 connected between power supply node VCC and internal node 112; a p channel MOS transistor PQ1 having one conduction node connected to internal node 112; a gate coupled to a node receiving a control signal φ4 and the other conduction node connected to an output node 113; and an n channel MOS transistor NQ2 having one conduction node connected to output node 113, a gate connected to a control signal input node 111, and the other conduction node coupled to receive the ground potential.

Load capacitance CL is provided between output node 113 and the ground node. MOS transistor NQ1 receives power supply voltage VCC at its gate and drain. MOS transistors PQ1 and NQ2 form an inverter and operate with the ground voltage and the voltage on internal node 112 as the two operation power supply voltages. Description will now be made of the operation of the semiconductor device shown in FIG. 31A with reference to the operation waveform diagram of FIG. 31B.

When clock signal φ3 is at a low level, internal node 112 is charged to the voltage Level of VCC−VTN by MOS transistor NQ1, where VTN is a threshold voltage of MOS transistor NQ1. When control signal φ4 is at a high level of power supply voltage VCC level, MOS transistor PQ1 is turned off (VCC>VCC−VTN), MOS transistor NQ2 is turned on, and control signal φp from output node 113 is at a low level.

When control signal φ4 falls from a high level to a low level, MOS transistor NQ2 is turned off and MOS transistor PQ1 is turned on. As a result, output node 113 is charged through MOS transistor PQ1, and control signal φp rises to the voltage level VCC−VTN of voltage on internal node 112. Subsequently, when control signal φ3 rises to a high level of power supply voltage VCC level, the voltage level of internal node 112 is raised to 2·VCC−VTN by charge pumping operation of capacitor C. The increase in potential on internal node 112 is transmitted through MOS transistor PQ1 to output node 113.

MOS transistor NQ1 is in an off state (because the voltage level of internal node 112 exceeds power supply voltage VCC), and the voltage level of control signal φp of output node 113 is raised by the electric charges applied from internal node 112 through MOS transistor PQ1. The increase in voltage level of control signal φp is determined by the capacitance values of capacitors C and CL. The increased voltage level of control signal φp is the voltage level where capacitances C and CL are equal in charge potential with each other. Therefore, similarly to the seventeenth embodiment, the charge potential of capacitor CL, i.e. the voltage level of control signal φp is raised by the voltage level of C·VCC/(CL+C) by control signal φ3.

When control signal φ4 rises to power supply voltage VCC, MOS transistor NQ2 is turned on, the charge potential of capacitor CL is discharged, and control signal φp falls to a low level of the ground voltage level. If control signal φ3 is still at the high level at this moment and the voltage level of internal node 112 exceeds power supply voltage VCC, MOS transistor PQ1 is turned on. In this case, the electric charges are discharged from internal node 112 to the ground node through MOS transistors PQ1 and NQ2, thereby reducing the voltage level of internal node 112. When control signal 43 falls to the low level of the ground voltage level, the voltage level of internal node 112 is also lowered to the ground voltage level, whereby MOS transistor PQ1 is completely turned off. At this time, internal node 112 is charged to the voltage level VCC−VTN by MOS transistor NQ1.

The semiconductor device shown in FIG. 31A is used for a circuit which generates a control signal attaining a high level of a boosted level only during a predetermined period in accordance with control signals φ3 and φ4. Such a circuit is employed at a portion generating a control signal for connecting the sense amplifier and the bit line in the shared sense amplifier arrangement or the word line driving signal. In the boosting circuit as shown in FIG. 31A, the voltage level of internal node 112 is raised by charge pumping operation of capacitor C. Greater capacitance value of capacitor C is desirable to generate boosted control signal φp at a desired voltage level. By employing the capacitor (indicated by Ca and Cb) described in the first through fourteenth embodiments above as capacitor C, a capacitor with great capacitance value can be realized with a small occupying area, so that a boosted circuit for generating a boosting control signal at a desired voltage level can be realized with a small occupying area.

Embodiment 19

Figure 32:
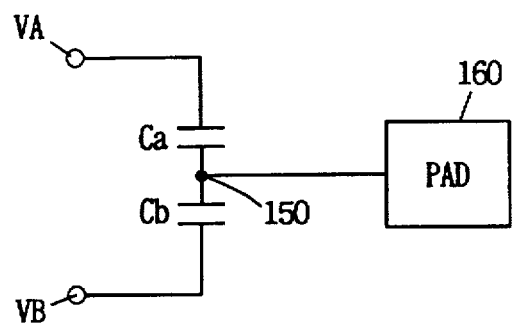
FIG. 32 schematically shows a structure of a semiconductor device according to a nineteenth embodiment of the present invention.

FIG. 32 is a diagram showing a structure of a main part of a semiconductor device according to a nineteenth embodiment of the present invention. Referring to FIG. 32, a pad 160 is connected to a connection node 150 between capacitors Ca and Cb. Capacitors Ca and Cb are connected in series between electrode nodes VA and VB. Capacitors Ca and Cb are the capacitors described in the first through fourteenth embodiments.

Even if the insulating film in one of capacitors Ca and Cb is not formed normally to exhibit dielectric breakdown and the one capacitor is in a short circuit electrically, the set of capacitors Ca and Cb connected in series can function as one capacitor provided that the voltage applied to electrode nodes VA and VB is low and dielectric breakdown is not caused in the other capacitor. However, a voltage twice as great as the voltage normally applied in a design specification is applied to the other normal capacitor. As a result, dielectric breakdown is caused in the other normal capacitor in actual use with the passage of time (time dependent dielectric breakdown). Prevention of shipment of such defective capacitors as products is required with reliability of the semiconductor device in view. Reliability of the product is improved by providing pad 160 to detect such insulation failure of capacitors Ca and Cb before shipment of products.

Figure 33A:
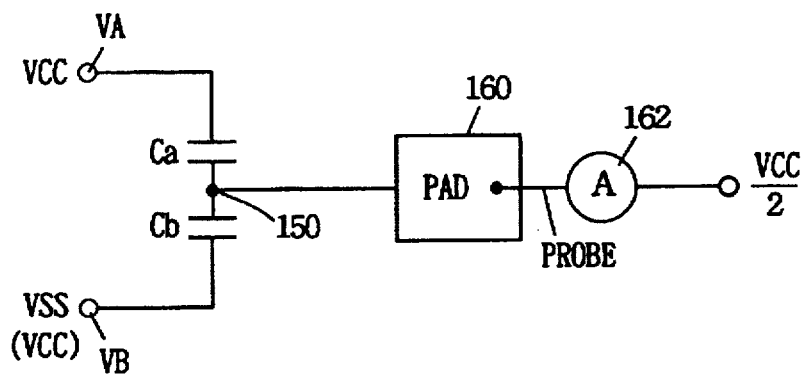
FIGS. 33A and 33B are diagrams for describing testing methods of the semiconductor device shown in FIG. 32.
Figure 33B:
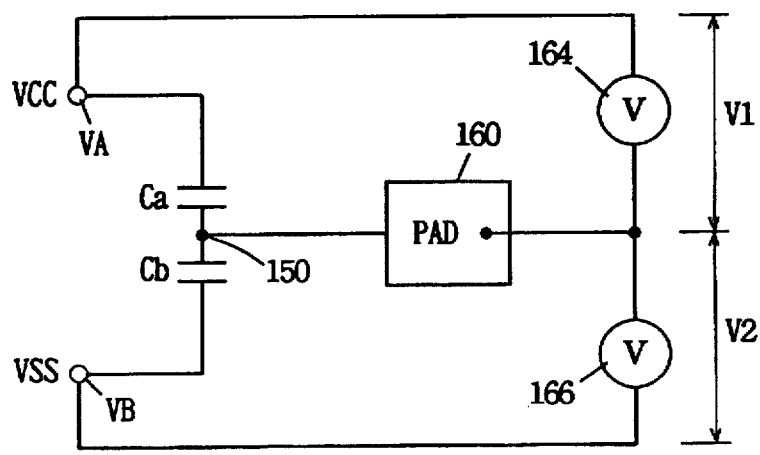

FIGS. 33A and 33B are diagrams for use in description of testing methods of the semiconductor device. Referring to FIG. 33A, an intermediate voltage (VCC/2) is applied to pad 160 through an ammeter 162 using a probe. Power supply voltage VCC and ground voltage VSS are applied to electrode nodes VA and VB, respectively. If capacitor Ca exhibits insulation failure (dielectric breakdown) and capacitor Cb operates normally, a current flows from electrode node VA through internal node 150 and pad 160 to an intermediate voltage generation source. On the contrary, if capacitor Ca operates normally and capacitor Cb exhibits failure, a current flows through ammeter 162, pad 160 and internal node 150 to electrode node VB. Thus, if only one of the capacitors shows failure (breakdown), the capacitor with a failure can be determined by observing the sign of the current flowing through ammeter 162. The capacitors causing current flow through ammeter 162 exceeding a predetermined value all suffer from dielectric breakdown and are determined as failures.

Next, power supply voltage VCC is applied to electrode nodes VA and VB. If at least one of capacitors Ca and Cb is a failure, a current flows from internal node 150 through pad 160 to ammeter 162. If a current greater than that flowing through ammeter 162 flows in the previous test described above as a result of the test, both capacitors Ca and Cb are determined defective.

Another method can be adopted in which the same voltage (power supply voltage VCC or ground voltage VSS) is first applied to electrodes VA and VB and a failure is found present if the current flowing through ammeter 162 exceeds a predetermined value.

FIG. 33B shows another testing method. Referring to FIG. 33B, a voltmeter 164 is connected between pad 160 and electrode node VA, and a voltmeter 166 is connected between pad 160 and electrode node VB. Power supply voltage VCC is applied to electrode node VA, and ground voltage VSS is applied to electrode node VB. If capacitors Ca and Cb operate normally, voltmeters 164 and 166 each read the voltage value of VCC/2. If capacitor Ca exhibits insulation failure, the voltage of internal node 150 exceeds intermediate voltage VCC/2. On the contrary, if capacitor Cb exhibits insulating failure, the voltage level of node 150 is lower than intermediate voltage VCC/2. If measured voltages V1 and V2 of voltmeter 164 and 166 are different from intermediate voltage VCC/2 by a predetermined value or greater, the capacitor of the semiconductor device is dealt as a failure.

Figure 34A:
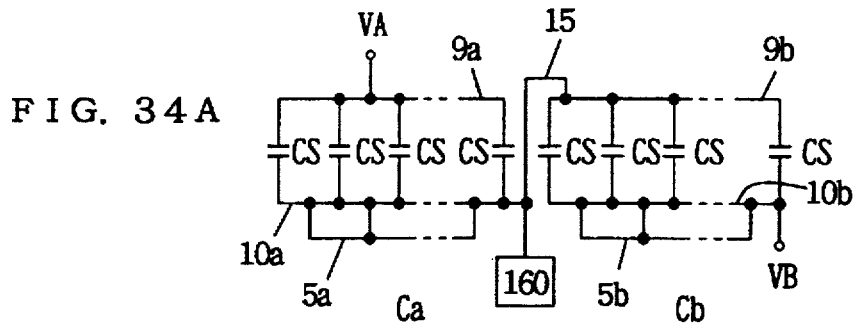
FIGS. 34A–34D show specific manners of connection between a capacitor and a pad of the semiconductor device according to the nineteenth embodiment of the present invention.

FIGS. 34A–34D specifically show how the capacitor and the pad are connected. Referring to FIG. 34A, the capacitor includes capacitor Ca constituted by capacitors CS formed between N well 10a and conductive layer 9a connected to electrode node VA, and capacitor Cb constituted by capacitors CS formed between N well 10b and conductive layer 9b. N wells 10a and 10b can be interconnected by conductive layers 5a and 5b corresponding to bit lines. N well 10a and conductive layer 9b are interconnected by interconnection 15. Interconnection 15 corresponds to internal node 150 shown in FIG. 32. Therefore, interconnection 15 is electrically connected to pad 160 in this case.

Figure 34B:
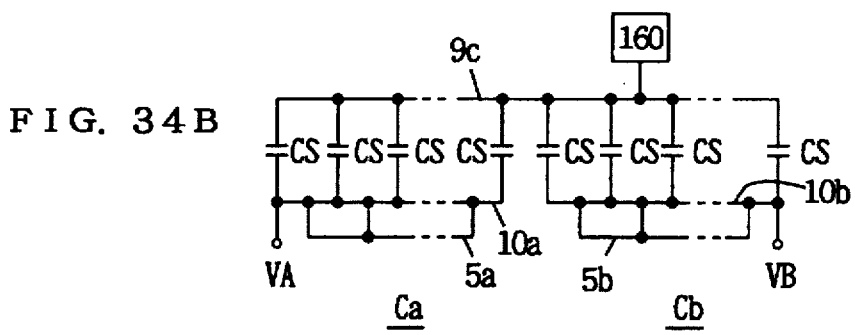

Referring to FIG. 34B, N well 10a is connected to electrode node VA, and N well 10b is electrically connected to electrode node VB. Conductive layer 9c is disposed in common to capacitors Ca and Cb. N wells 10a and 10b can be interconnected by conductive layers 5a and 5b corresponding to bit lines. Conductive layers 5a and 5b may not be provided. In this structure, conductive layer 9c corresponds to internal node 150 shown in FIG. 32. Therefore, conductive layer 9c is electrically connected to pad 160.

Figure 34C:
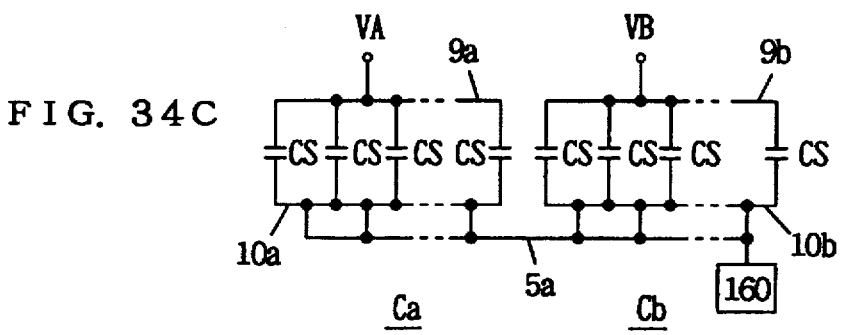

Referring to FIG. 34C, conductive layer 9a is connected to electrode node VA and conductive layer 9b is electrically connected to electrode node VB. N wells 10a and 10b are isolated from each other and interconnected by conductive layer 5a corresponding to a bit line. Therefore, connection node 150 between capacitors Ca and Cb corresponds to conductive layer 5a. In this structure, conductive layer 5a is electrically connected to pad 160.

Figure 34D:
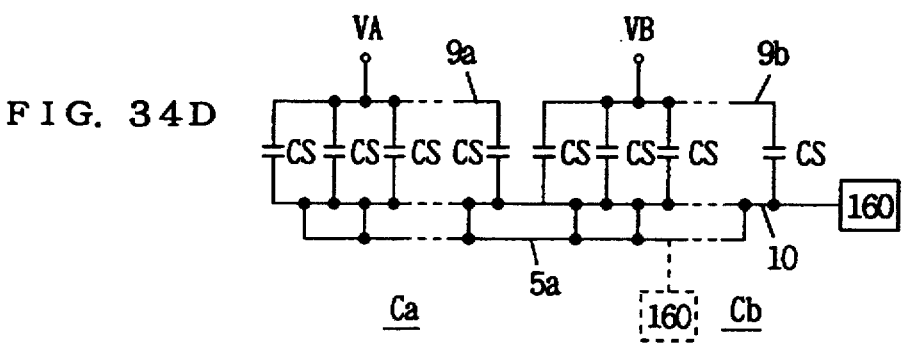

Referring to FIG. 34D, conductive layer 9a is connected to electrode node VA, and conductive layer 9b is electrically connected to electrode node VB. The other electrode nodes of capacitors Ca and Cb are interconnected by N well 10. Conductive layer 5a corresponding to a bit line can be connected to N well 10. Conductive layer 5a may not be provided. In this structure, N well 10 corresponds to the connection node between capacitors Ca and Cb, and N well 10 is electrically connected to pad 160. Here, conductive layer 5a, if provided, can be electrically connected to pad 160 as indicated by the broken line in FIG. 34D.

As described above, in accordance with the nineteenth embodiment of the present invention, a pad is electrically connected to the connection node of capacitors, so that the capacitor likely to cause insulation failure (dielectric breakdown) can be identified to improve reliability of the device.

Embodiment 20

Figure 35:
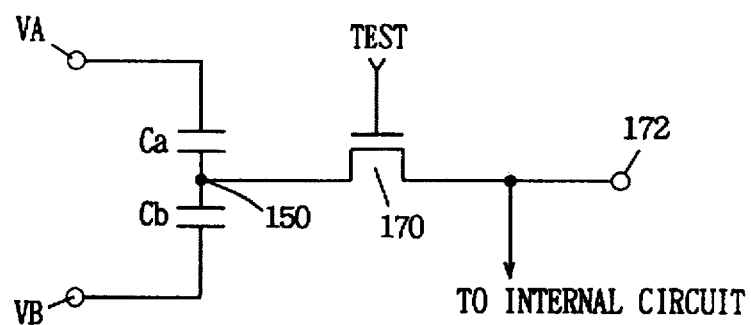
FIG. 35 schematically shows a structure of a semiconductor device according to a twentieth embodiment of the present invention.

FIG. 35 is a diagram showing a structure of a main part of a semiconductor device according to a twentieth embodiment of the present invention. Referring to FIG. 35, a switching transistor 170 rendered conductive in response to a test instruction signal TEST is arranged between connection node 150 of capacitors Ca and Cb and an external pin terminal 172. Capacitors Ca and Cb are connected in series between electrode nodes VA and VB. Capacitors Ca and Cb have the same structure as any capacitor described in the first through fourteenth embodiments above. External pin terminal 172 is used by an internal circuit which is not shown during normal operation and performs input or output operation of signals.

Test mode instruction signal TEST can be directly applied from the outside world or can be activated by using the combination of operation timings of a plurality of control signals or of the timing conditions of a plurality of control signals and particular address key.

When the device is packaged, a predetermined voltage cannot be externally applied to pad 160 through a probe as described in the nineteenth embodiment. Therefore, connection node 150 of capacitors Ca and Cb is electrically connected to external pin terminal 172 in accordance with test mode instruction signal TEST.

Figure 36:
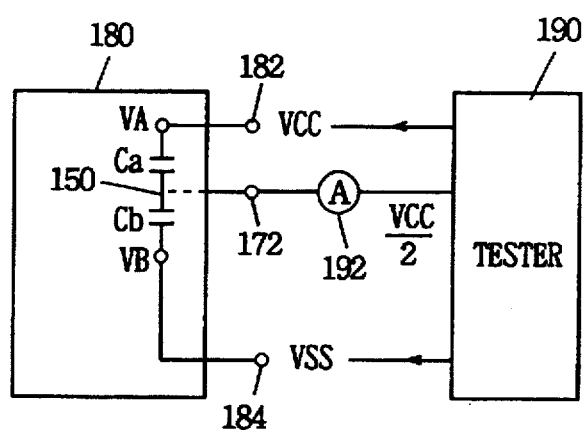
FIG. 36 is a diagram for describing a testing method of the semiconductor device shown in FIG. 35.
Figure 38:
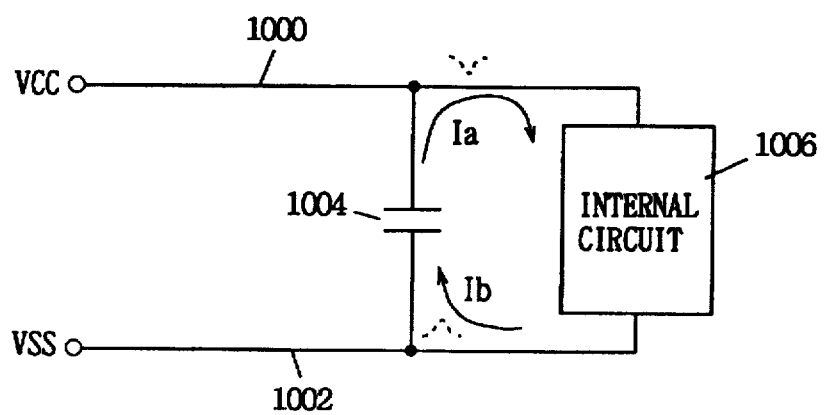
FIG. 38 is a diagram for describing functions of a decoupling capacitor in a conventional semiconductor device.

FIG. 36 is a diagram showing how the semiconductor device according to the twentieth embodiment is tested. Capacitors Ca and Cb are contained in a package 180. External pin terminals 182, 172, and 184 are arranged for package 180. External pin terminal 182 is electrically connected to electrode node VA, and external pin terminal 184 is electrically connected to electrode node VB. In the test mode, external pin terminal 172 is connected to connection node 150 of capacitors Ca and Cb. During testing operation, power supply voltage VCC and ground voltage VSS are applied to external pin terminals 182 and 184 from a tester 190. A predetermined voltage (intermediate voltage VCC/2) is applied to external pin terminal 172 through an ammeter 192. Determination is made whether the current flowing through ammeter 192 has a value exceeding a predetermined value, and the semiconductor device causing a current flow having a value equal to or greater than the predetermined value is determined defective. Electrode node VB may receive power supply voltage VCC through external pin terminal 184. The method similar to that in the nineteenth embodiment is employed in such arrangement.

According to the method shown in FIG. 36, connection node 150 can be connected to external pin terminal 170 in accordance with test instruction signal TEST in the final test before shipment of products and whether capacitors Ca and Cb potentially or apparently have insulation failure or not is determined by external tester 190, so that reliability of the products can be improved.

Switching transistor 170 can be electrically connected to the pad in the nineteenth embodiment described above.

Figure 37A:
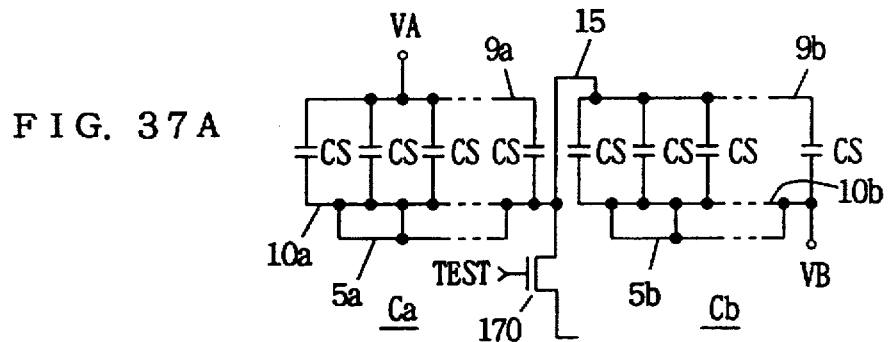
FIGS. 37A–37D show specific manners of connection between a capacitor and a switching transistor in a semiconductor device shown in FIG. 35.

FIGS. 37A–37D specifically show how the switching transistor and the capacitance elements are connected in the twentieth embodiment. Referring to FIG. 37A, the capacitance element includes capacitor Ca formed by capacitors CS between conductive layer 9a and N well 10a, and capacitor Cb constituted by capacitors CS formed between conductive layer 9b and N well 10b. Conductive layer 9a is electrically connected to electrode node VA, and N well 10b is electrically connected to electrode node VB. N well 10a is electrically connected to conductive layer 9b through interconnection 15. Therefore, switching transistor 170 is arranged for interconnection 15 in this structure.

Figure 37B:
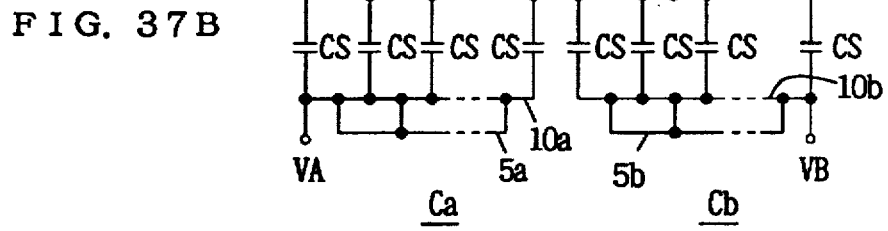

Referring to FIG. 37B, capacitor Ca is formed by capacitors CS between conductive layer 9c and N well 10a, and capacitor Cb is formed by capacitors CS between conductive layer 9c and N well 10b. N well 10a is connected to electrode node VA, and N well 10b is electrically connected to electrode node VB. Conductive layers 5a and 5b can be interconnected to N wells 10a and 10b. Since the connection node corresponds to conductive layer 9c in this structure, switching transistor 170 is electrically connected to conductive layer 9c.

Figure 37C:
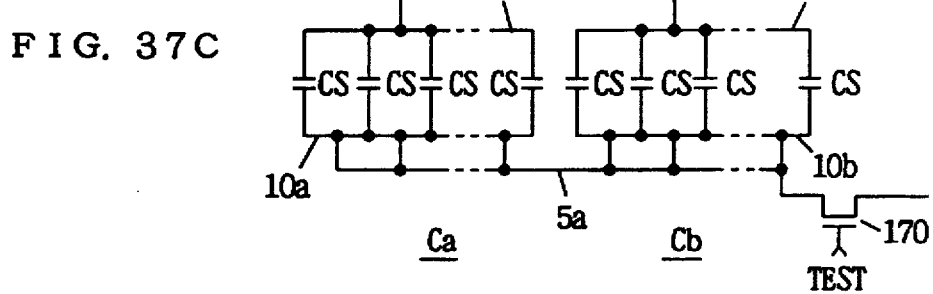

Referring to FIG. 37C, capacitor Ca is formed by capacitors CS between conductive layer 9a and N well 10a, and capacitor Cb is formed by capacitors CS between conductive layer 9b and N well 10b. Conductive layers 9a and 9b are electrically connected to electrode nodes VA and VB, respectively. N wells 10a and 10b are electrically interconnected by conductive layer 5a. Therefore, the connection node is provided by conductive layer 5a, and thus switching transistor 170 is electrically connected to conductive layer 5a.

Figure 37D:
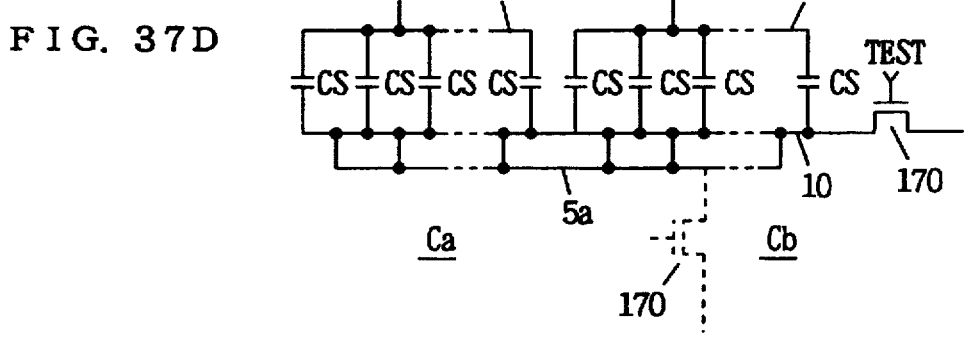

Referring to FIG. 37D, capacitance element Ca is formed by capacitors CS between conductive layer 9a and N well 10 and capacitor Cb is formed by capacitors CS between conductive layer 9b and N well 10. Conductive layers 9a and 9b are connected to electrode nodes VA and VB, respectively. The N well is provided in common to capacitors Ca and Cb. Conductive layer 5a can be interconnected to N well 10. In this structure, N well 10 or conductive layer 5a forms the connection node, and therefore switching transistor 170 is connected to N well 10 or conductive layer 5a.

As described above, according to the twentieth embodiment of the present invention, the connection node of the capacitors is selectively connected to the external pin terminal in accordance with the test mode instruction signal, so that the insulation failure test of the capacitor can be performed in the final test before shipment of the products even after the semiconductor device is packed in the package, leading to an improvement in reliability of the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a capacitance having one and another electrodes, said capacitance comprising:
a first capacitance element and a second capacitance element connected in series between said one and another electrodes;
said first capacitance element including
(a) a first group of a plurality of first impurity regions of a first conductivity type arranged at a surface of a first semiconductor substrate region of the first conductivity type and spaced apart from each other and electrically connected with an electrically conductive path connected to each other through the first semiconductor substrate region,
(b) a first group of a plurality of first conductive layers, each conductive layer electrically connected to a predetermined corresponding first impurity region of said first group, formed having predetermined shapes on the surface of said first semiconductor substrate region an separated from each other, and
(c) a second conductive layer arranged to face the first conductive, layers of said first group with a first insulating layer interposed therebetween, and,
said second capacitance element comprising
(d) a second group of a plurality of first impurity regions the first conductivity type arranged at a surface of a second semiconductor substrate region of the first conductivity type and spaced apart from each other and electrically connected to each other through the second semiconductor substrate region,
(e) a second group of a plurality of first conductive layer, each conductive layer electrically connected to a predetermined corresponding first impurity region of said second group, formed having predetermined shapes on the surface of said second semiconductor substrate region, and separated from each other, and (f) a third conductive layer arranged to face the first conductive layers of said second group with a second insulating film interposed therebetween.

2. The semiconductor memory device according to claim 1, wherein said second conductive layer is isolated from said third conductive layer, said first semiconductor substrate region and said second semiconductor substrate region constitute a common substrate region, and said second and third conductive layers are electrically connected to said one and another electrodes, respectively.

3. The semiconductor device according to claim 2, further comprising a pad electrically connected to said common semiconductor substrate region.

4. The semiconductor device according to claim 2, further comprising a switching element coupled to receive a test mode instruction signal instructing a predetermined test mode operation to be performed when active, and responsive to activation of the test mode instruction signal for electrically connecting said common semiconductor substrate region to an external terminal.

5. The semiconductor device according to claim 2, further comprising a second impurity region of the first conductivity type formed between said first and second groups at the surface of the common semiconductor substrate region.

6. The semiconductor memory device according to claim 1, wherein said second conductive layer is isolated from said third conductive layer, said first and second semiconductor regions are formed separated from each other, said first semiconductor substrate region is electrically connected to said third conductive layer through an interconnection, and said second conductive layer and said second substrate region are electrically connected to said one and another electrodes.

7. The semiconductor device according to claim 6, further comprising a second impurity region of the first conductive type formed at the surface of said first semiconductor substrate region and electrically connected to said third conductive layer.

8. The semiconductor memory device according to claim 1, wherein said second and third conductive layers are electrically connected to constitute a common conductive layer, said first and second substrate regions are electrically isolated from each other and are electrically connected to said one and another electrodes, respectively.

9. The semiconductor device according to claim 8, further comprising a pad electrically connected to said second and third conductive layers.

10. The semiconductor device according to claim 8, further comprising a switching element coupled to receive a test mode instruction signal instructing a predetermined test mode operation to be performed when active, and responsive to activation of the test mode instruction signal for electrically connecting said second and third conductive layers to an external pin.

11. The semiconductor memory device according to claim 1, wherein said plurality of first conductive layers are connected to said first impurity regions, respectively.

12. The semiconductor memory device according to claim 1, further comprising a fourth conductive layer formed to have a prescribed shape between adjacent first impurity regions among said plurality of first impurity regions in said first and second groups on the surface of said semiconductor substrate region with a fourth insulating film interposed between the fourth conductive layer and said semiconductor substrate region.

13. The semiconductor device according to claim 12, wherein said fourth conductive layers are divided into a first group of fourth conductive layers electrically connected to said second conductive layer and a second group of fourth conductive layers electrically connected to said third conductive layer.

14. The semiconductor device according to claim 13, wherein said first impurity regions are arranged in a matrix of rows and columns and said fourth conductive layer is arranged to extend in a row direction.

15. The semiconductor device according to claims 12, further comprising a plurality of memory cells arranged in a matrix and formed on a semiconductor substrate region of- a second conductivity type separated from said capacitance, and each having (a) third and fourth impurity regions of the first conductivity type arranged to be isolated from each other on the surface of said semiconductor substrate region of the second conductivity type, (b) a gate electrode layer formed between said third and fourth impurity regions on the substrate region, (c) a sixth conductive layer serving as a storage node electrically connected to said third impurity region, and (d) a seventh conductive layer arranged to face said sixth conductive layer with an insulating film interposed therebetween and serving as a cell plate electrode layer receiving a predetermined voltage, wherein said first conductive layer is formed of an interconnection layer same as said sixth conductive layer, said second and third conductive layers are formed of an interconnection layer same as said seventh conductive layer, and said fourth conductive layer is formed of an interconnection layer same as said gate electrode layer.

16. The semiconductor device according to claim 1, further comprising a fifth conductive layer formed on said first and second semiconductor substrate regions and electrically connected to predetermined first impurity regions among said plurality of first impurity regions for electrically interconnecting said predetermined first impurity regions in each of said first and second groups.

17. The semiconductor device according to claim 16, wherein said first impurity regions are arranged in a matrix of rows and columns and said fifth conductive layer is arranged corresponding to each column and extending in a column direction.

18. The semiconductor device according to claim 17, further comprising an interconnection for electrically interconnecting portions of the fifth conductive layer on the columns in each of said first and second groups.

19. The semiconductor device according to claims 16, further comprising a plurality of memory cells arranged in a matrix and formed on a semiconductor substrate region of a second conductivity type separated from said capacitance, and each having (a) third and fourth impurity regions of the first conductivity type arranged to be isolated from each other on the surface of said semiconductor substrate region of the second conductivity type, (b) a gate electrode layer formed between said third and fourth impurity regions on the substrate region, (c) a sixth conductive layer serving as a storage node electrically connected to said third impurity region, and (d) a seventh conductive layer arranged to face said sixth conductive layer with an insulating film interposed therebetween and serving as a cell plate electrode layer receiving a predetermined potential, wherein said first conductive layer is formed of an interconnection layer same as said sixth conductive layer, said second and third conductive layers are formed of an interconnection layer same as said seventh conductive layer, and said fifth conductive layer is formed of an interconnection layer same as an eighth conductive layer serving as a bit line electrically connected to the column of memory cells.

20. The semiconductor device according to claim 16, further comprising a pad electrically connected to said fifth conductive layer.

21. The semiconductor device according to claim 16, further comprising a switching element coupled to receive a test mode instruction signal instructing a predetermined test mode operation to be performed when active, and responsive to activation of the test mode instruction signal for electrically connecting said fifth conductive layer to an external terminal.

22. The semiconductor device according to claim 16, further comprising an interconnection for electrically interconnecting said fifth conductive layer in each of said first and second groups to constitute a common conductive layer.

23. The semiconductor device according to claim 16, wherein said fifth conductive layer in said first group is isolated from said fifth conductive layer in said second group.

24. The semiconductor device according to claim 1, further comprising an element isolation insulating film formed at the surface of said first and second semiconductor substrate region between a first impurity region connected to a first conductive layer of said first group and a first impurity region connected to first conductive layers of said second group.

25. The semiconductor device according to claim 1, further comprising clock application means for applying a clock signal to said one electrode, and voltage generation means for generating a predetermined potential in accordance with a potential of said another electrode.

26. The semiconductor device according to claim 1, further comprising a plurality of memory cells arranged in a matrix of rows and columns and formed on a semiconductor substrate region of a second conductivity type separated from said capacitance, and each having (a) third and fourth impurity regions of the first conductivity type arranged to be isolated from each other on the surface of said semiconductor substrate region of the second conductivity type, (b) a gate electrode layer formed between said third and fourth impurity regions on the substrate region, (c) a sixth conductive layer serving as a storage node electrically connected to said third impurity region, and (d) a seventh conductive layer arranged to face said sixth conductive layer with a fourth insulating film interposed therebetween and serving as a cell plate electrode layer for receiving a predetermined potential, wherein said first conductive layer is formed of an interconnection layer same as said sixth conductive layer, and said second and third conductive layers are formed of an interconnection layer same as said seventh conductive layer.

* * * * *